(12) United States Patent
Kumura

(10) Patent No.: US 11,991,939 B2
(45) Date of Patent: May 21, 2024

(54) METHOD OF MANUFACTURING A MEMORY DEVICE COMPRISING INTRODUCING A DOPANT INTO SILICON OXIDE

(71) Applicant: Kioxia Corporation, Tokyo (JP)

(72) Inventor: Yoshinori Kumura, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/079,161

(22) Filed: Dec. 12, 2022

(65) Prior Publication Data

US 2023/0108500 A1    Apr. 6, 2023

Related U.S. Application Data

(62) Division of application No. 17/016,155, filed on Sep. 9, 2020, now Pat. No. 11,557,725.

(30) Foreign Application Priority Data

Mar. 10, 2020    (JP) .................................. 2020-040607

(51) Int. Cl.
*H10N 70/00* (2023.01)
*H10B 61/00* (2023.01)
*H01L 29/36* (2006.01)

(52) U.S. Cl.
CPC ......... *H10N 70/8833* (2023.02); *H10B 61/10* (2023.02); *H10N 70/043* (2023.02); *H10N 70/063* (2023.02); *H10N 70/841* (2023.02); *H01L 29/36* (2013.01)

(58) Field of Classification Search
CPC .... H10B 61/10; H10N 70/043; H10N 70/063; H10N 70/841
See application file for complete search history.

(56) References Cited

U.S. PATENT DOCUMENTS

| | | | |
|---|---|---|---|
| 4,637,128 A | 1/1987 | Mizutani | |
| 5,428,244 A | 6/1995 | Segawa et al. | |
| 6,027,969 A | * 2/2000 | Huang ................. | H10B 12/318 438/254 |
| 9,960,350 B2 | 5/2018 | Ha | |
| 10,446,227 B2 | 10/2019 | Ota et al. | |
| 11,037,984 B1 | 6/2021 | Song | |

(Continued)

FOREIGN PATENT DOCUMENTS

| | | |
|---|---|---|
| JP | S614240 A | 1/1986 |
| JP | 2615922 B2 | 4/1990 |

(Continued)

OTHER PUBLICATIONS

Notice of Allowance dated Sep. 20, 2022, issued in parent U.S. Appl. No. 17/016,155.

(Continued)

*Primary Examiner* — Herve-Louis Y Assouman
*Assistant Examiner* — Christopher M Roland
(74) *Attorney, Agent, or Firm* — Holtz, Holtz & Volek PC

(57) ABSTRACT

According to one embodiment, a method of manufacturing a memory device including a silicon oxide and a variable resistance element electrically coupled to the silicon oxide, includes: introducing a dopant into the silicon oxide from a first surface of the silicon oxide by ion implantation; and etching the first surface of the silicon oxide with an ion beam.

7 Claims, 23 Drawing Sheets

(56) References Cited

U.S. PATENT DOCUMENTS

| | | |
|---|---|---|
| 2002/0044479 A1 | 4/2002 | Ikeda |
| 2013/0062588 A1 | 3/2013 | Sakotsubo |
| 2013/0248813 A1 | 9/2013 | Fujii et al. |
| 2015/0357566 A1* | 12/2015 | Wang .................. H10N 70/841 257/4 |
| 2016/0087199 A1 | 3/2016 | Jang et al. |
| 2016/0118442 A1 | 4/2016 | Kim et al. |
| 2017/0352807 A1 | 12/2017 | Ha |
| 2021/0135107 A1* | 5/2021 | Kim ....................... H10N 70/24 |
| 2022/0085278 A1 | 3/2022 | Igarashi |
| 2022/0093847 A1 | 3/2022 | Ochiai et al. |

FOREIGN PATENT DOCUMENTS

| | | |
|---|---|---|
| JP | H0851211 A | 2/1996 |
| JP | 2019057582 A | 4/2019 |

OTHER PUBLICATIONS

Office Action (Non-Final Rejection) dated Jun. 7, 2022, issued in parent U.S. Appl. No. 17/016,155.

* cited by examiner

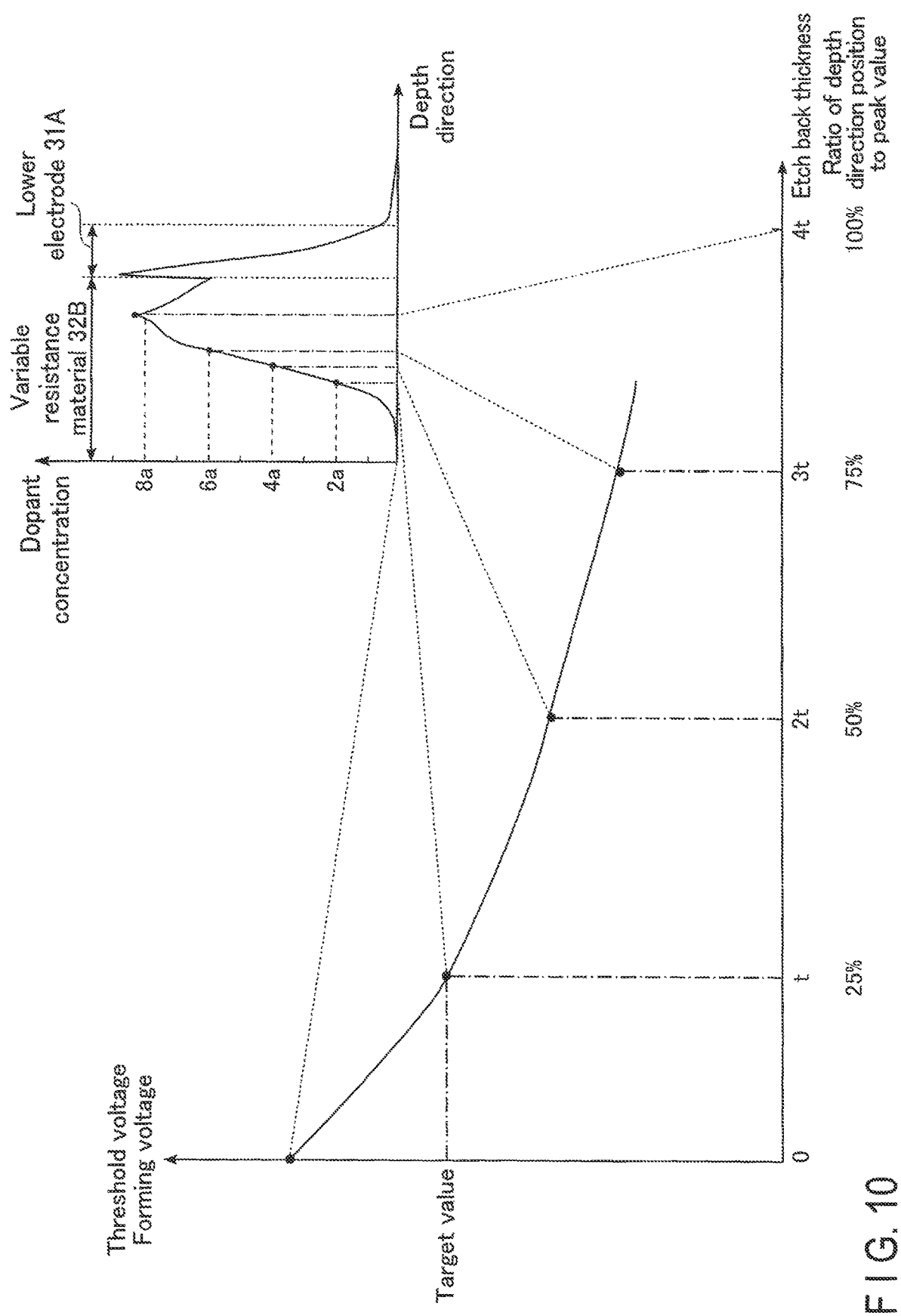
F I G. 10

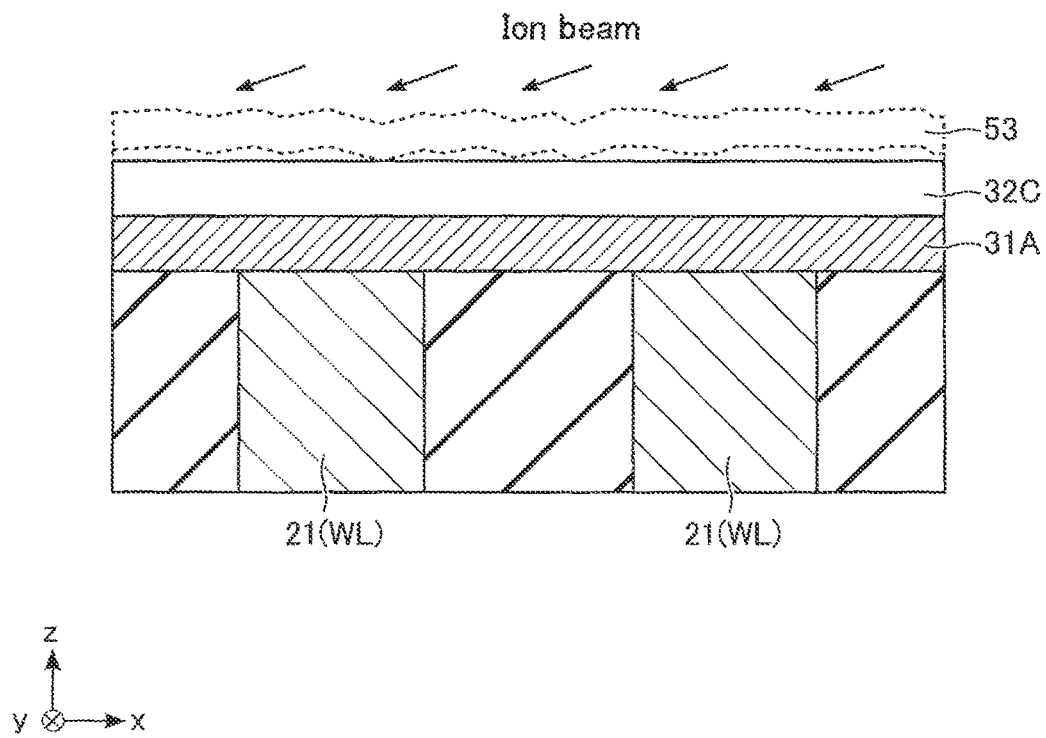
F I G. 23
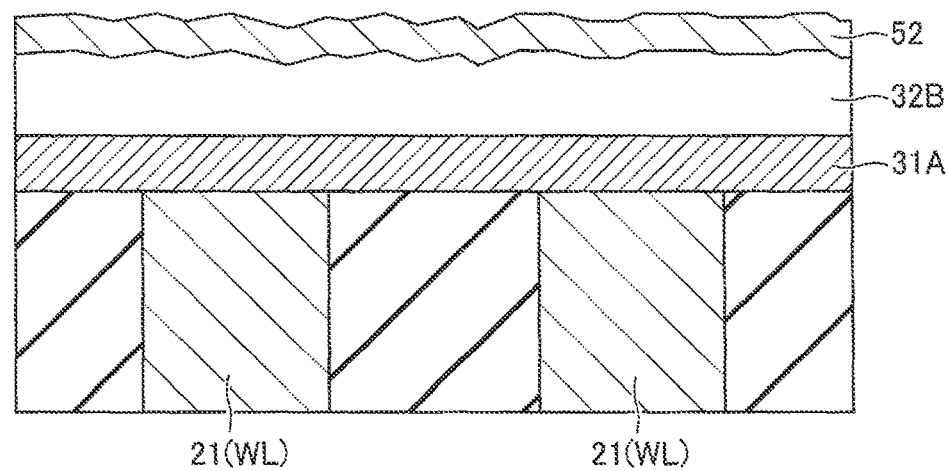
F I G. 24

METHOD OF MANUFACTURING A MEMORY DEVICE COMPRISING INTRODUCING A DOPANT INTO SILICON OXIDE

CROSS-REFERENCE TO RELATED APPLICATIONS

This application is a Divisional application of U.S. application Ser. No. 17/016,155, filed on Sep. 9, 2020, which is based upon and claims the benefit of priority from Japanese Patent Application No. 2020-40607, filed Mar. 10, 2020, the entire contents of all of which are incorporated herein by reference.

FIELD

Embodiments described herein relate generally to memory devices.

BACKGROUND

A memory device that uses a magnetoresistance effect element is known in the art.

BRIEF DESCRIPTION OF THE DRAWINGS

FIGS. 6 to 10 sequentially show how structures of part of the memory device of the first embodiment are during a manufacturing process.

FIGS. 21 to 23 sequentially show how structures of part of a memory device of the fourth embodiment are during a manufacturing process.

FIGS. 24 and 25 sequentially show how structures of part of the memory device of the fourth embodiment are during a manufacturing process.

DETAILED DESCRIPTION

Figure 1:
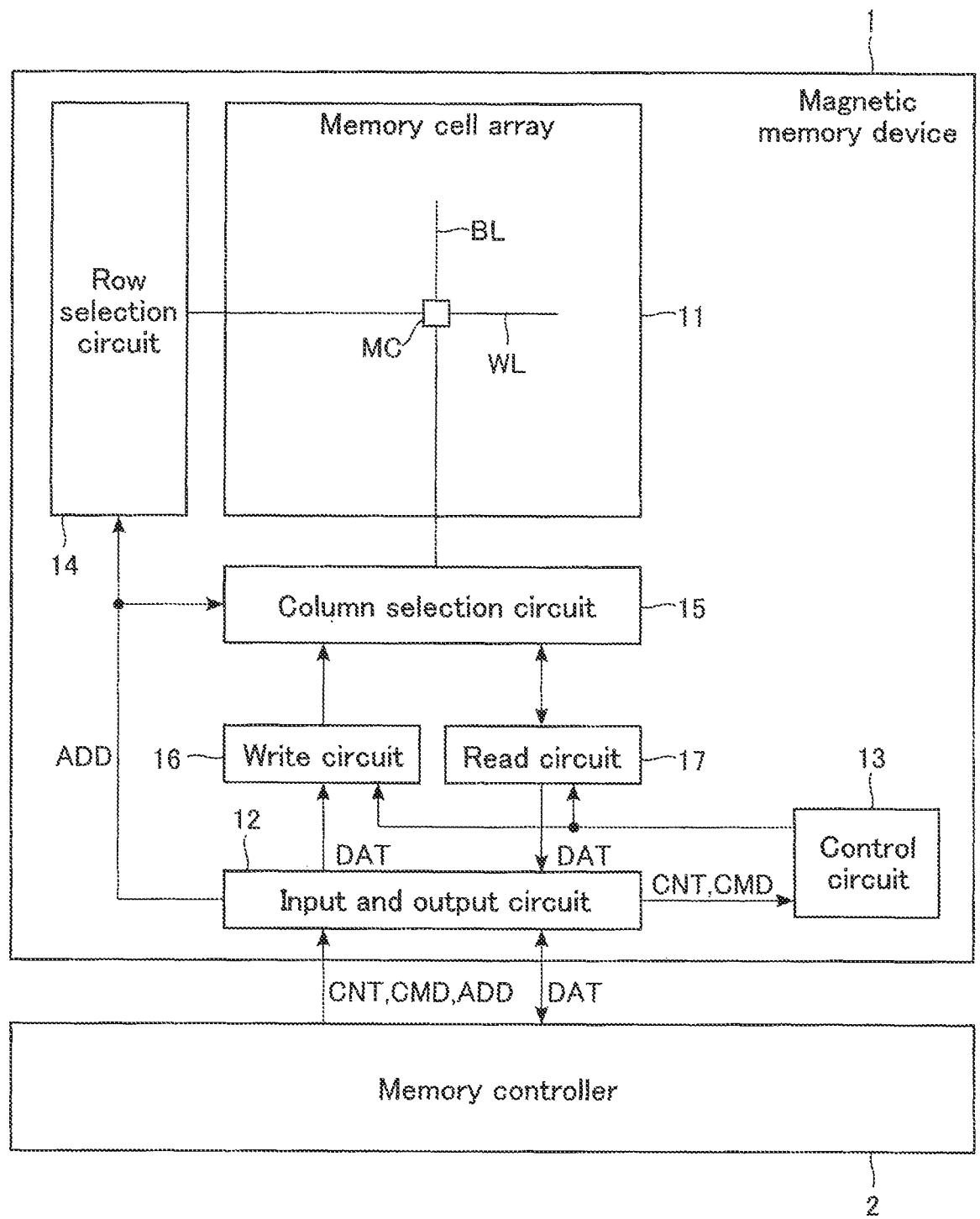
FIG. 1 shows functional blocks of a memory device of the first embodiment.

In general, according to one embodiment, a method of manufacturing a memory device including a silicon oxide and a variable resistance element electrically coupled to the silicon oxide, includes: introducing a dopant into the silicon oxide from a first surface of the silicon oxide by ion implantation; and etching the first surface of the silicon oxide with an ion beam.

Embodiments will now be described with reference to the Figures.

In the following description, components with substantially the same functions and configurations will be referred to with the same reference numerals, and repeated descriptions may be omitted. In order to distinguish components having substantially the same function and configuration from each other, an additional numeral or letter may be added to the end of each reference numeral.

The Figures are schematic, and the relations between the thickness and the area of a plane of a layer and ratios of thicknesses of layers may differ from actual products. Moreover, the Figures may include components which differ in relations and/or ratios of dimensions in different figures. Moreover, the entire description for a particular embodiment also applies to other embodiments unless explicitly mentioned otherwise or obviously eliminated. Each embodiment illustrates the device and method for materializing the technical idea of that embodiment, and the technical idea of an embodiment does not specify the quality of the material, shape, structure, arrangement of components, etc. to the following.

In the specification and the claims, a phrase of a particular first component being "coupled" to another second component includes the first component being coupled to the second component either directly or via one or more components which are always or selectively conductive.

The embodiments will be described by using an xyz orthogonal coordinate system.

In the description below, the term "below" as well as terms derived therefrom and terms related thereto refer to a position having a smaller coordinate on the z-axis, and the term "above" as well as terms derived therefrom and terms related thereto refer to a position having a larger coordinate on the z-axis.

First Embodiment

<1. Structure (Configuration)>
<1.1. Overall Structure>

FIG. 1 illustrates functional blocks of memory device of the first embodiment. As shown in FIG. 1, a memory device 1 includes a memory cell array 11, an input and output circuit 12, a control circuit 13, a row selection circuit 14, a column selection circuit 15, a write circuit 16, and a read circuit 17.

The memory cell array 11 includes memory cells MC, word lines WL, and bit lines BL. The memory cell MC can store data in a non-volatile manner. Each memory cell MC is coupled to one word line WL and one bit line BL. Each word line WL is associated with a row. Each bit line BL is associated with a column. Selection of one row and selection of one or more columns specify one or more memory cells MC.

The input and output circuit 12 receives various types of control signals CNT, various types of commands CMD, an address signal ADD, and data (write data) DAT that are supplied, for example, from a memory controller 2, and transmits data (read data) DAT, for example, to the memory controller 2.

The row selection circuit 14 receives the address signal ADD from the input and output circuit 12, and brings one word line WL associated with the row that is specified by the received address signal ADD into a selected state.

The column selection circuit 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the data reading from the memory cell array 11.

The write circuit 16 receives write data DAT from the input and output circuit 12 and supplies the voltages used for data writing to the column selection circuit 15 based on the control by the control circuit 13 and the write data DAT.

The read circuit 17 includes a sense amplifier, and based on the control of the control circuit 13, uses the voltages for data reading to determine data stored in the memory cells MC.

<1.2. Circuit Configuration of Memory Cell Array>

Figure 2:
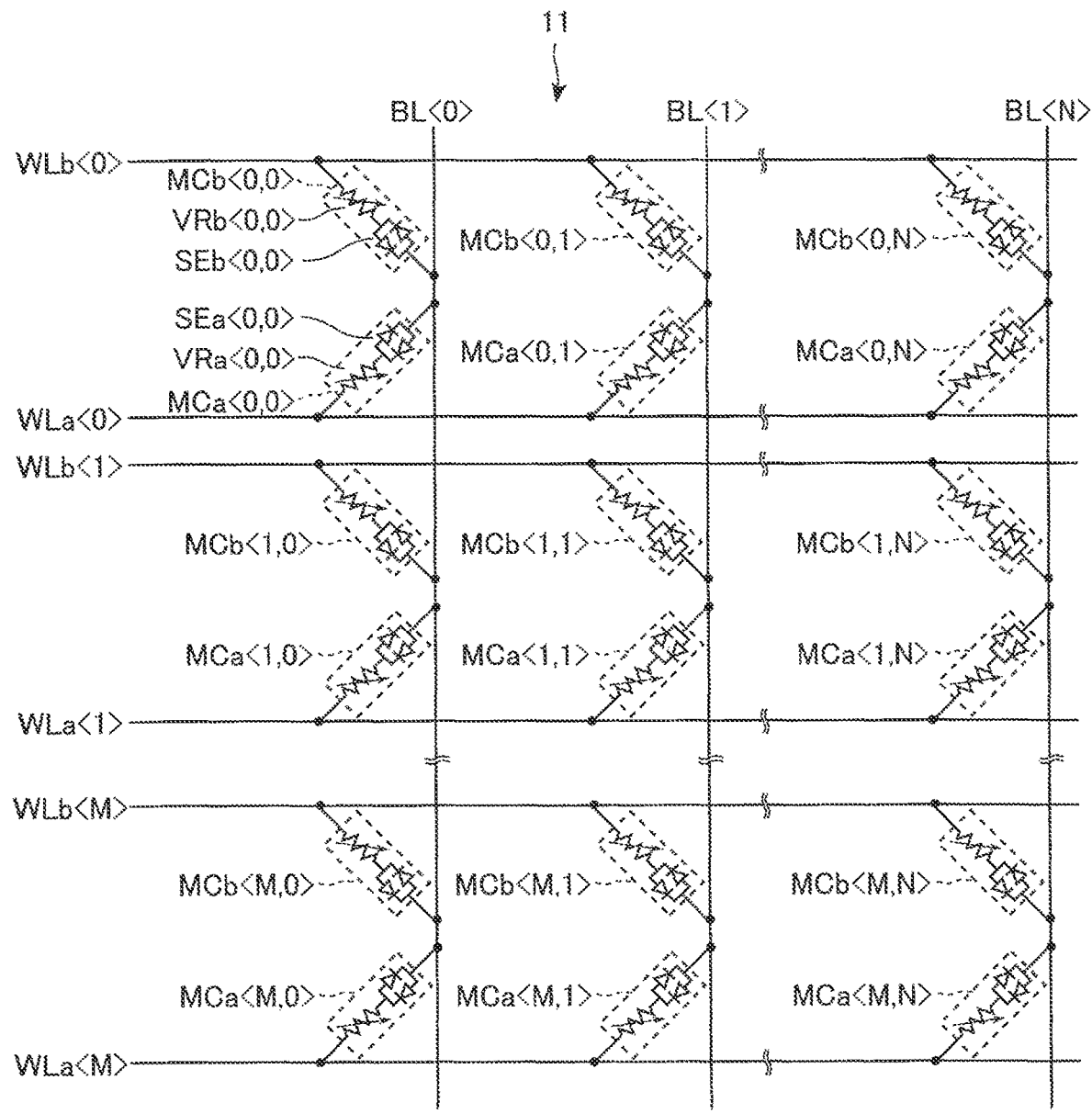
FIG. 2 is a circuit diagram of a memory cell array of the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, . . . , and WLa<M>) and (M+1) word lines WLb (WLb<0>, WLb<1>, . . . , and WLb<M>), where M is a natural number. The memory cell array 11 also includes (N+1) bit lines BL (BL<0>, BL<1>, . . . , and BL<N>), where N is a natural number.

Each of the memory cells MC (MCa and MCb) includes two nodes: a first node coupled to one word line WL; and a second node coupled to one bit line BL. More specifically, the memory cells MCa encompass memory cells MCa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N, and the memory cell MCa<$\alpha$, $\beta$> is coupled between the word line WLa<$\alpha$> and the bit line BL<$\beta$>. Similarly, the memory cells MCb encompass memory cells MCb<$\alpha$, $\beta$>, for all combinations of $\alpha$ and $\beta$, where $\alpha$ is every integer equal to or greater than 0 and equal to or less than M, and $\beta$ is every integer equal to or greater than 0 and equal to or less than N, and the memory cell MCb<$\alpha$, $\beta$> is coupled between the word line WLb<$\alpha$> and the bit line BL<$\beta$>.

Each memory cell MC includes one variable resistance element VR (VRa or VRb) and one selector SE (SEa or SEb). More specifically, the memory cell MCa<$\alpha$, $\beta$> includes a variable resistance element VRa<$\alpha$, $\beta$> and a selector SEa<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N. Moreover, each memory cell MCb<$\alpha$, $\beta$> includes a variable resistance element VRb<$\alpha$, $\beta$> and a selector SEb<$\alpha$, $\beta$> for all combinations of $\alpha$ and $\beta$, where $\alpha$ is every integer equal to or greater than 0 and equal to or less than M, and $\beta$ is every integer equal to or greater than 0 and equal to or less than N.

In each memory cell MC, the variable resistance element VR and the selector SE are coupled in series. The variable resistance element VR is coupled to one word line WL, and the selector SE is coupled to one bit line BL.

The variable resistance element VR can switch between a low-resistance state and a high-resistance state. The variable resistance element VR can store 1-bit data, utilizing the difference in the two resistance states. Examples of the variable resistance element VR include a magnetoresistance effect element that exhibits a magnetoresistance effect, and a phase change element. The description given below is based on the example in which the variable resistance element VR is a magnetoresistance effect element.

The selector SE may be a switching element, for example. The switching element includes two terminals, and, when a voltage lower than a first threshold is applied in a first direction between the two terminals, the switching element is in a high-resistance state, i.e., electrically non-conductive (in an off state). On the other hand, when a voltage equal to or higher than a first threshold is applied in the first direction between the two terminals, the switching element is in a low-resistance state, for example, electrically conductive (in an on state). The switching element is further equipped with a function similar to the function of switching between the high-resistance state and the low-resistance state based on the magnitude of the voltage applied in the first direction, with respect to a second direction opposite to the first direction. For the second direction case, the switching element is turned on or off based on a second threshold, which corresponds to the first threshold for the first direction case and may be the same or different from the first value. By turning on or off the switching element, it is possible to perform control as to whether or not to supply a current to a variable resistance element VR coupled to the switching element, namely, whether or not to select the variable resistance element VR.

<1.3. Circuit Configuration of Memory Cell Array>

Figure 3:
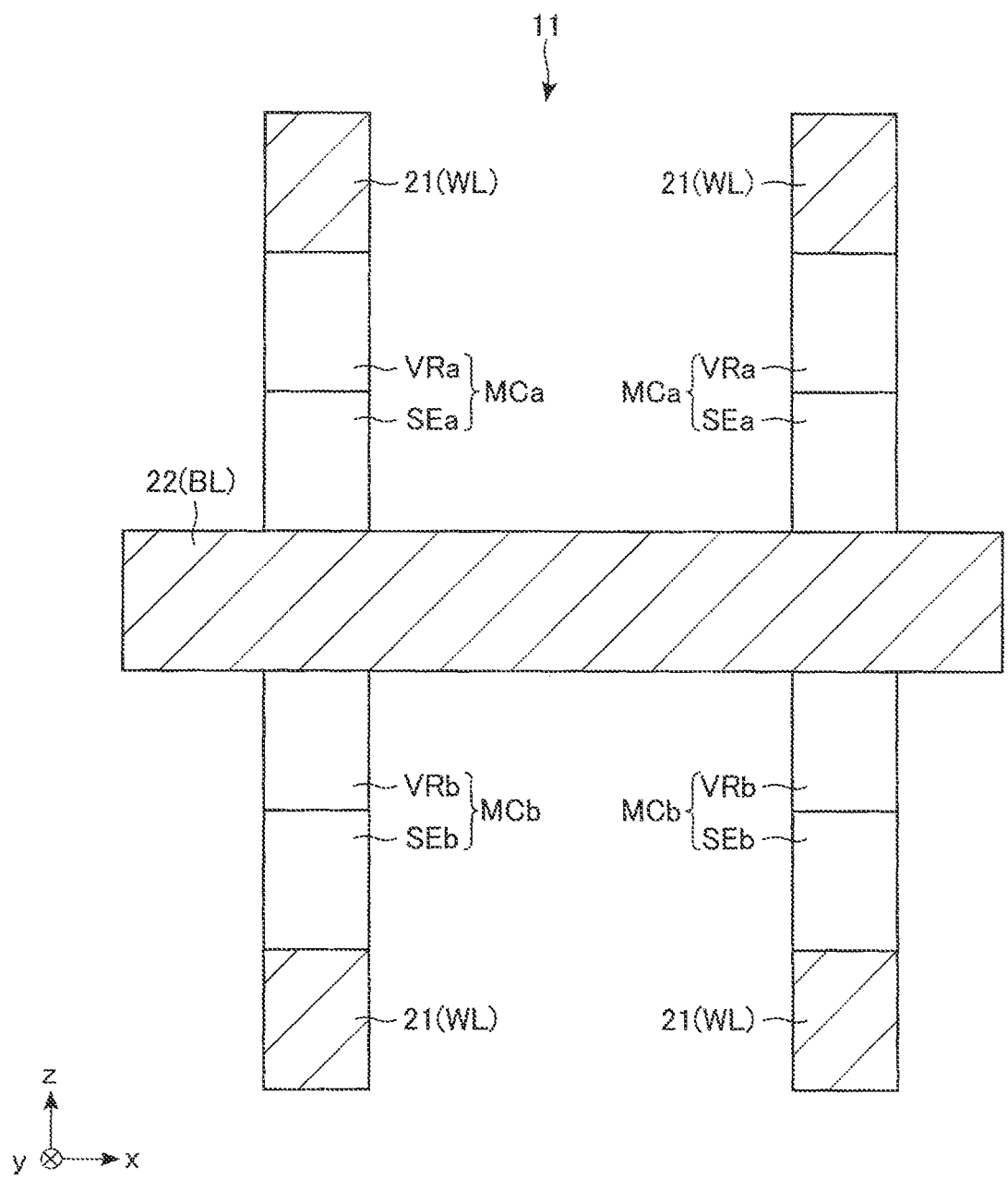
FIG. 3 shows a cross-sectional structure of part of the memory cell array of the first embodiment.

FIG. 3 shows a cross-section structure of part of the memory cell array 11 of the first embodiment. As shown in FIG. 3, a plurality of conductors 21 are provided above a semiconductor substrate (not shown). The conductors 21 extend along the y-axis, and are aligned along the x-axis. Each conductor 21 functions as one word line WL.

Each conductor 21 is coupled, at its top surface, to the bottom surfaces of a plurality of memory cells MCb. The memory cells MCb are aligned along the y-axis on each conductor 21, and this arrangement provides a matrix of memory cells MCb. Each memory cell MC includes a structure that functions as a selector SE and a structure that functions as a variable resistance element VR. The structure that functions as a selector SE and the structure that functions as a variable resistance element VR each have one or more layers, as will be described later.

A plurality of conductors 22 are provided above the memory cells MCb. The conductors 22 extend along the x-axis, and are aligned along the y-axis. Each conductor 22 is coupled, at its bottom surface, to the top surfaces of a plurality of memory cells MCb aligned along the x-axis. Each conductor 22 functions as one bit line BL.

Each conductor 22 is coupled, at its top surface, to the bottom surfaces of a plurality of memory cells MCa. The memory cells MCa are aligned along the x-axis on each conductor 22, and this arrangement provides a matrix of memory cells MCa. A further conductor 21 is provided on the top surfaces of the memory cells MCa aligned along the y-axis. The memory cell array 11 as shown in FIG. 2 can be realized by repeatedly providing the structure from the lower-most layer of conductor 21 to the layer of memory cells MCa shown in FIG. 2 along the z-axis.

The memory cell array 11 further includes an inter-layer insulator in a region where the conductors 21, conductors 22, and memory cells MC are not provided.

<1.4. Structure of Memory Cell>

Figure 4:
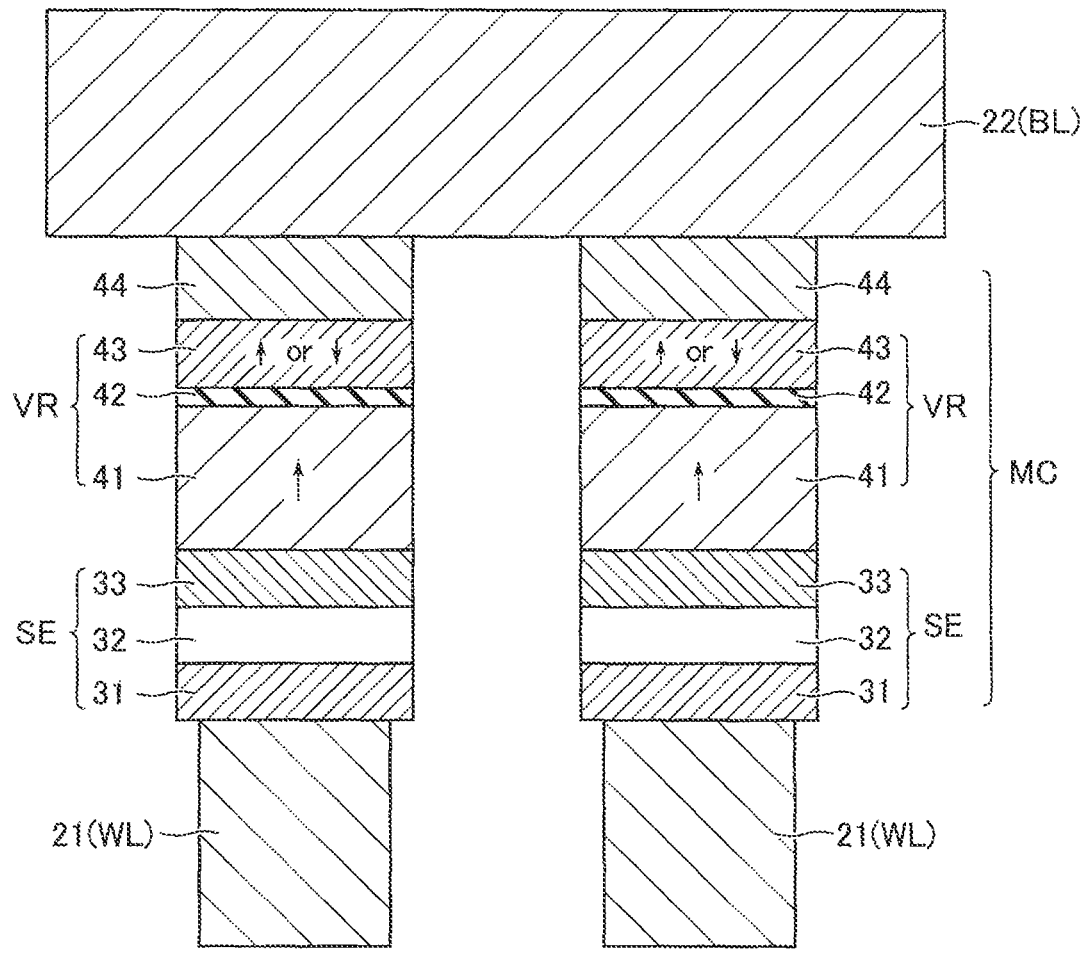
FIG. 4 shows a cross section of an example of a structure of a memory cell of the first embodiment.

FIG. 4 shows a cross section of an example of how a structure of a memory cell MC of the first embodiment is. As described with reference to FIG. 3, each memory cell MC includes a selector SE and a variable resistance element VR on the top surface of the selector SE. Each memory cell MC may include further layers. Examples of such layers include a hard mask 44 on the top surface of the variable resistance element VR. FIG. 4 and the description below are based on this example.

The selector SE includes a variable resistance material (layer) 32. As shown in FIG. 4, the selector SE may further include a lower electrode 31 and an upper electrode 33. The variable resistance material 32 is, for example, a switching element between two terminals, the first of the two terminals corresponding to one of the top surface and bottom surface of the variable resistance material 32, the second of the two terminals corresponding to the other one of the top surface and bottom surface of the variable resistance material 32. The variable resistance material 32 includes silicon oxide ($SiO_2$) and contains a dopant introduced by ion implantation. Examples of the dopant include arsenic (As), germanium (Ge), antimony (Sb), xenon (Xe) and krypton (Kr).

The lower electrode 31 and the upper electrode 33 include or are made of, for example, titanium nitride (TiN).

The variable resistance element VR includes a magnetic tunnel junction (MTJ), and exhibits a tunneling magnetoresistance effect. Specifically, the variable resistance element VR includes a ferromagnet (ferromagnetic layer) 41, an insulator (insulating layer) 42, and a ferromagnet (ferromagnetic layer) 43. For example, as shown in FIG. 4, the insulator 42 is on the top surface of the ferromagnet 41, and the ferromagnet 43 is on the top surface of the insulator 42. The ferromagnet 41 has an easy magnetization axis along a direction (indicated by an arrow in the ferromagnet 41) penetrating interfaces between the ferromagnet 41, the insulator 42, and the ferromagnet 43, such as an easy magnetization axis at an angle from 45° to 90° with respect to the interfaces, or an easy magnetization axis along a direction orthogonal to the interfaces. The direction of magnetization of ferromagnet 41 is intended to remain unchanged even when data is read or written in the memory device 1. The ferromagnet 41 can function as a so-called reference layer. The ferromagnet 41 may include a plurality of layers. The ferromagnet 41 may have a synthetic antiferromagnetic (SAF) structure. In this case, the ferromagnet 41 includes two ferromagnets and a conductor provided between the two ferromagnets. The conductor causes two ferromagnets to exchange-couple antiferromagnetically.

The insulator 42 either contains or is made of, for example, magnesium oxide (MgO), and functions as a so-called "tunnel barrier".

The ferromagnet 43 either contains or is made of, for example, cobalt iron boron (CoFeB) or iron boride (FeB). The ferromagnet 43 has an easy magnetization axis along a direction (indicated by an arrow in the ferromagnet 43) penetrating interfaces between the ferromagnet 41, insulator 42, and ferromagnet 43, such as an easy magnetization axis at an angle from 45° to 90° with respect to the interfaces, or an easy magnetization axis along a direction orthogonal to the interfaces. The magnetization direction of ferromagnet 43 can be changed by data writing, and the ferromagnet 43 can function as a so-called "storage layer".

When the magnetization direction of ferromagnet 43 is parallel to the magnetization direction of ferromagnet 41, the variable resistance element VR is in a lower resistance state. When the magnetization direction of ferromagnet 43 is anti-parallel to the magnetization direction of ferromagnet 41, the variable resistance element VR is in a higher resistance state.

When a certain magnitude of write current flows from the ferromagnet 43 to the ferromagnet 41, the magnetization direction of ferromagnet 43 becomes parallel to the magnetization direction of ferromagnet 41. In contrast, when another magnitude of write current flows from the ferromagnet 41 to the ferromagnet 43, the magnetization direction of ferromagnet 43 becomes anti-parallel to the magnetization direction of ferromagnet 41.

The hard mask 44 is made of a conductor. Inter-layer insulators (not shown) are provided on the portions other than the components shown in FIG. 4.

<1.5. Dopant Concentration Distribution in Variable Resistance Material>

Figure 5:
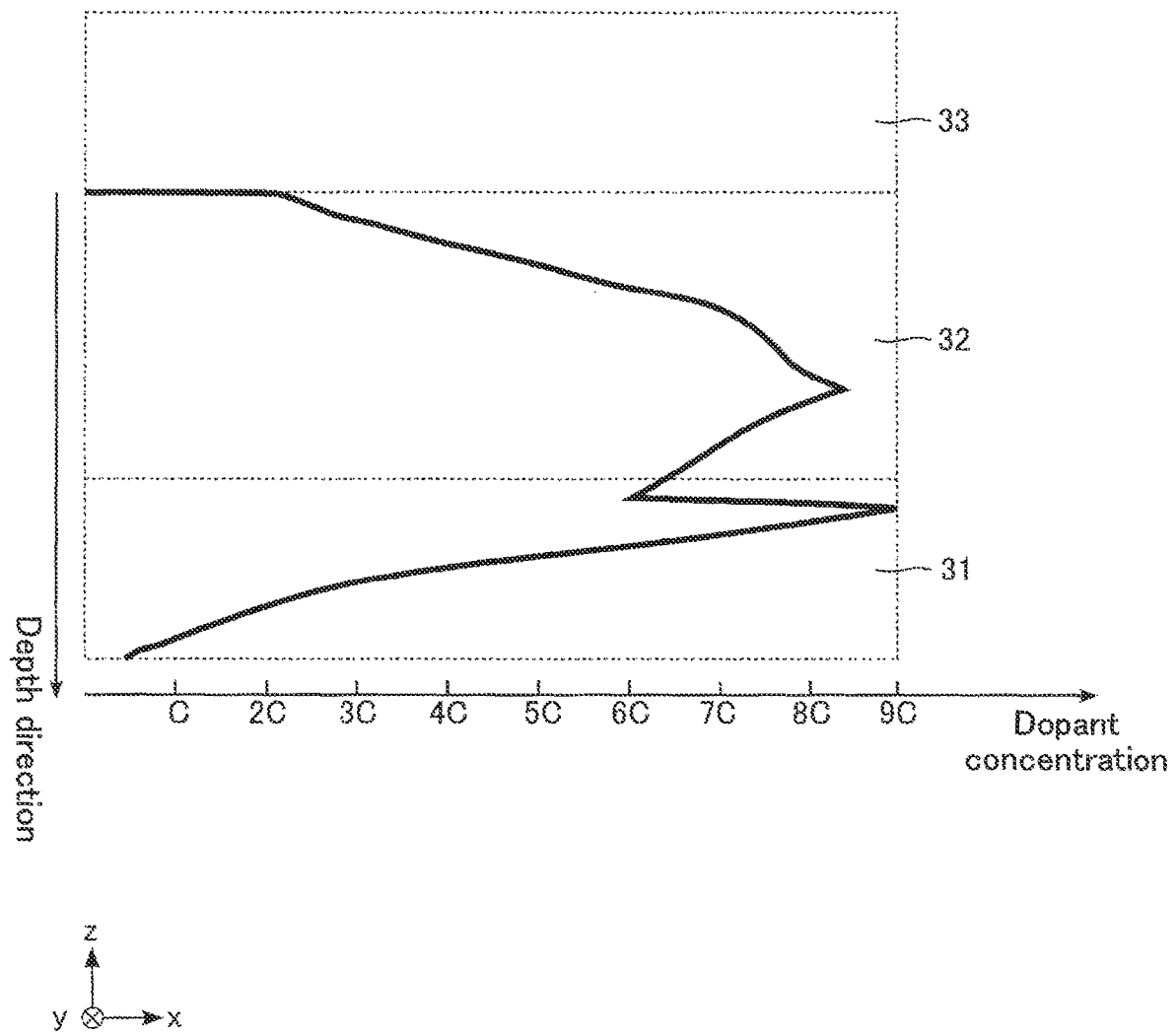
FIG. 5 shows an example of the dopant concentration distribution in a variable resistance material of the first embodiment.

FIG. 5 shows an example of how the dopant concentration distribution is in a variable resistance material 32 of the first embodiment. FIG. 5 shows a dopant concentration distribution obtained by performing ion implantation under certain conditions into a variable resistance material 32 with a certain thickness. As shown in FIG. 5, some of the irradiated ions pass through the variable resistance material 32 and reach the lower electrode 31. In the description below, with respect to the set of variable resistance material 32 and lower electrode 31, the direction away from the upper electrode 33 along the z-axis will be referred to as a depth direction.

In general, the dopant concentration distribution formed by ion implantation has a normal distribution (or, a Gaussian distribution) that spreads along the ion traveling direction in an ion implantation target. In the example shown in FIG. 5, the dopant concentration distribution has a certain local maximum value in the variable resistance material 32. In FIG. 5, the dopant concentration distribution has a peak in the lower electrode 31. This is because the variable resistance material 32 and the lower electrode 31 are made of different materials. In the description below, for convenience of description, the maximum concentration in the variable resistance material 32 included in the set of variable resistance material 32 and lower electrode 31 will be referred to as a peak concentration. In general, the dopant concentration in an ion implantation target is almost zero in the vicinity of the surface from which the ions enter. The closer to the inside of the ion implantation target from the ion entering surface, the higher will be the dopant concentration. Likewise, the dopant concentration is zero at a position that is away from the ion entering surface of the set of variable resistance material 32 and lower electrode 31 in the depth direction. In the example shown in FIG. 5, the dopant concentration is zero in the bottom surface of the lower electrode 31.

On the other hand, as shown in FIG. 5, the dopant concentration of the variable resistance material 32 is much higher than zero even in the top surface of the variable resistance material 32, that is, in the interface between the variable resistance material 32 and the upper electrode 33. That is, the dopant concentration in the top surface of the variable resistance material 32 is higher than the dopant concentration in the bottom surface of the lower electrode 31. In the example shown in FIG. 5, in the dopant concentration distribution, the dopant concentration in the top surface of the variable resistance material 32 is approximately one fourth of the peak concentration in the variable resistance material 32.

<1.6. Manufacturing Method>

A manufacturing method of the memory device of the first embodiment will be described with reference to FIGS. 6 to 10. FIGS. 6 to 10 sequentially show how structures of part of the memory device of the first embodiment are during a manufacturing process.

Figure 6:
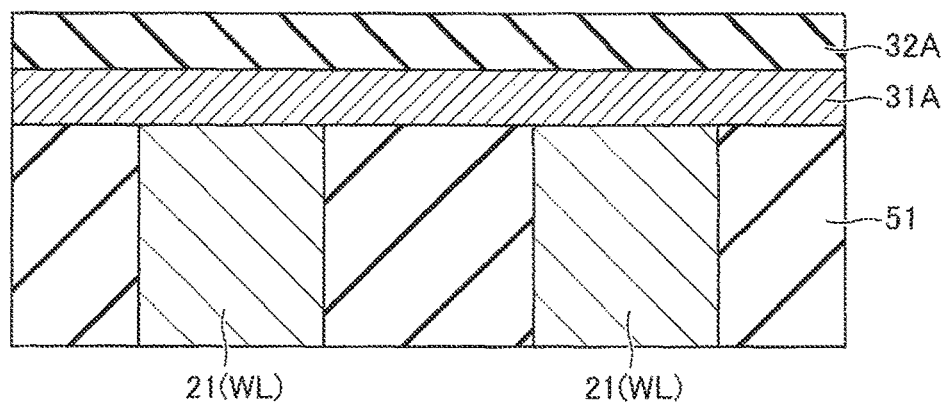

As shown in FIG. 6, a plurality of conductors 21 (word lines WL) and an inter-layer insulator 51 are formed. The inter-layer insulator 51 is located in the region between the conductors 21, and fills the region between the conductors 21, for example. Then, a lower electrode 31A is formed. The lower electrode 31A is a conductor that is later processed into lower electrode 31. The lower electrode 31A spreads in the xy plane over the top surfaces of conductors 21 and the top surface of inter-layer insulator 51. A silicon oxide (layer) 32A is formed on the top surface of the lower electrode 31A. The silicon oxide 32A spreads in the xy plane. The silicon oxide 32A is a component that is processed into variable resistance material 32 in a later process.

Figure 7:
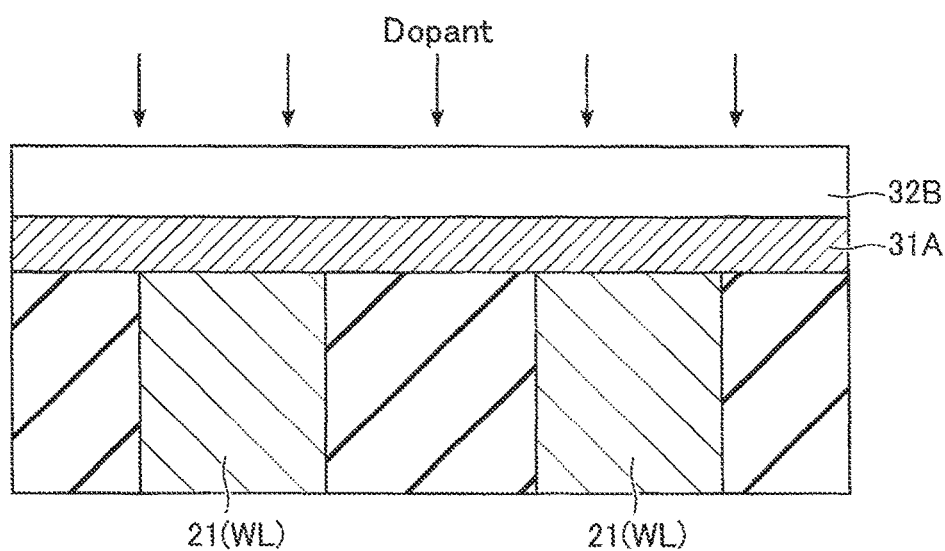

As shown in FIG. 7, arsenic ions are introduced into the silicon oxide 32A from above by ion implantation. The silicon oxide 32A is a component that is processed into variable resistance material 32 as described above, and the ion implantation is performed using a dose amount or energy that enables the variable resistance material 32 to have desired characteristics. For example, the ion implantation is performed under the condition that permits the peak concentration of the dopant to be located below the center of the silicon oxide 32A as viewed in the depth direction. By the ion implantation, the silicon oxide 32A is turned into the variable resistance material 32B.

Figure 8:
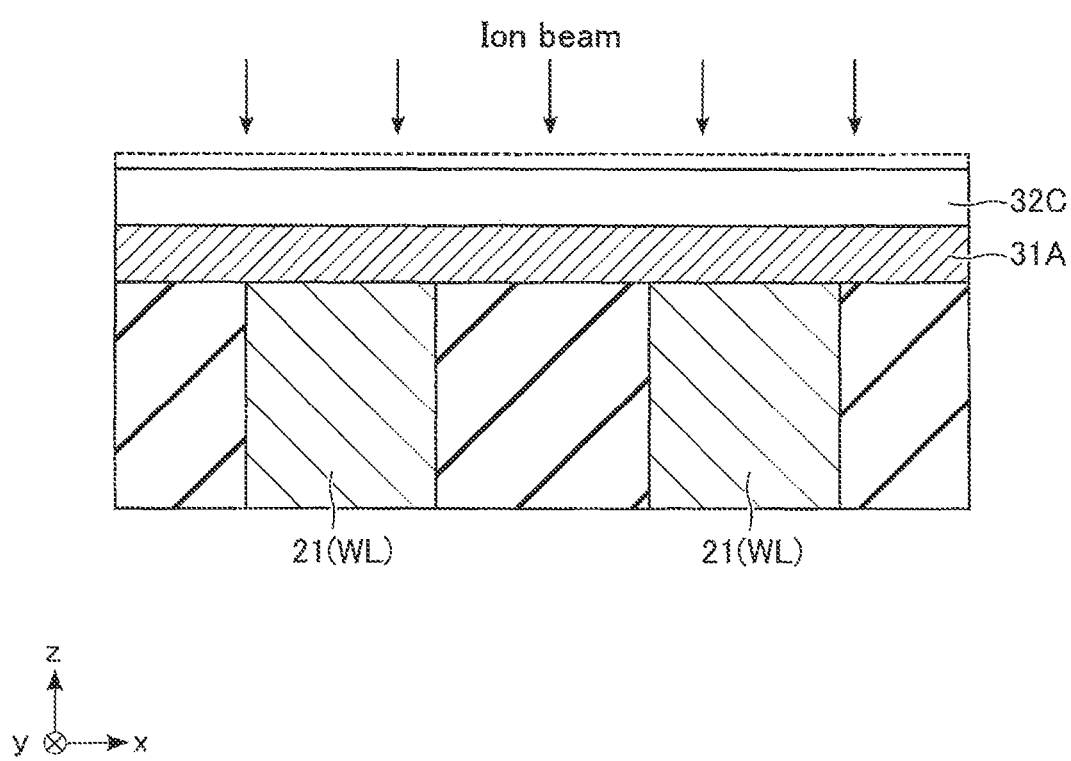

As shown in FIG. 8, the top surface of the variable resistance material 32B is subjected to etch back by ion beam etching (IBE). Examples of ion beams for IBE include Argon (Ar), Kr and Xe. By the IBE, the top surface of variable resistance material 32B is lowered, and variable resistance material 32B is turned into variable resistance material 32C. Variable resistance material 32C is a component that is processed into variable resistance material 32 in a later process, and has, for example, the same or substantially the same thickness as variable resistance material 32.

Figure 9:
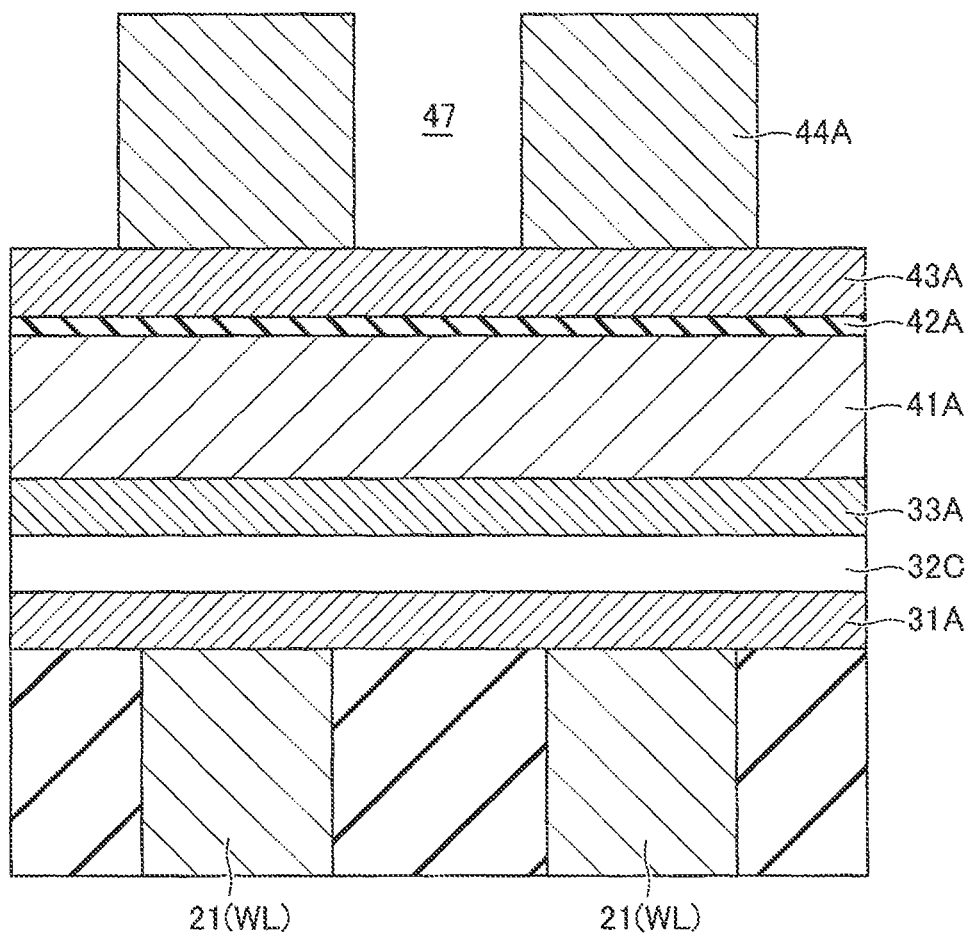

As shown in FIG. 9, an upper electrode 33A, a ferromagnet 41A, an insulator 42A and a ferromagnet 43A are formed in this order on the top surface of variable resistance material 32C. The upper electrode 33A, the ferromagnet 41A, the insulator 42A and the ferromagnet 43A are components that are turned into upper electrode 33, ferromagnet 41, insulator 42 and ferromagnet 43, respectively, in a later process.

A hard mask 44A is formed on the top surface of the ferromagnet 43A. The hard mask 44A remains above the region where the memory cells MC are to be formed, and has openings 47 in the remaining portions. The ferromagnet 43A, insulator 42A, ferromagnet 41A, upper electrode 33A, variable resistance material 32C and lower electrode 31A are partially removed by IBE using the hard mask 44A as a mask. As a result, as shown in FIG. 4, ferromagnet 43, insulator 42, ferromagnet 41, upper electrode 33, variable resistance material 32 and lower electrode 31 are formed. By the IBE, the top surface of the hard mask 44A is lowered, and the hard mask 44A is turned into hard mask 44. Thereafter, conductor 22 is formed.

<1.7. Details of Etch Back of Silicon Oxide 32A>

With reference to FIG. 10, the etch back of the silicon oxide 32A described with reference to FIG. 8 will be described further.

In the lower left portion, FIG. 10 shows an example of a relationship between the amount (or, thickness) of etch back of the silicon oxide 32A of the first embodiment and voltages related to the characteristics of the variable resistance material 32. FIG. 10 also shows an example of how the dopant concentration distribution in the variable resistance material 32B is immediately after the end of the process shown in FIG. 7, that is, before the etch back is performed.

The characteristics of the variable resistance material 32 include a threshold voltage that is a boundary voltage at which the variable resistance material 32 is switched on or off, as described with reference to FIG. 2, such as the first or second threshold value described with reference to FIG. 2, and also include a forming voltage. The forming voltage is a characteristic that a variable resistance material, including variable resistance material 32, generally has. The variable resistance material, including variable resistance material 32, must first be applied with a certain voltage before the variable resistance material starts to be used in order to enable the variable resistance material to exhibit the switching function. Only after such a voltage is applied, variable resistance material 32 can perform switching, and this voltage is called a forming voltage. The threshold voltage and the forming voltage depend, at least in part, on the current conducting capability of the variable resistance material. The current conducting capability depends at least in part on the concentration of the dopant in the variable resistance material when the variable resistance material is a silicon-based material. The threshold voltage and the forming voltage are set to certain target values in order to allow the variable resistance material 32 to have desired characteristics. The top surface of variable resistance material 32B (the surface where the coordinates of the axis along the depth direction of variable resistance material 32B (the axis in the depth direction) are zero) is subjected to etch back by an amount determined to attain such value. In the description below, a certain coordinate on the depth axis may be referred to as a depth direction position.

In the example of the dopant concentration distribution in variable resistance material 32B shown in FIG. 10, where the peak concentration is =8C (C is a specific value) and the dopant concentration in the top surface of the variable resistance material 32B is one fourth (=2C) of the peak concentration, the threshold voltage and the forming voltage of the variable resistance material 32 have target values. Based on this relationship, the etch back thickness from the top surface of variable resistance material 32B is determined. Based on the example shown in FIG. 10, where the distance between the depth direction position having the peak concentration and the top surface of variable resistance material 32B is regarded as 100%, the dopant concentration is 2a where the depth direction position is 25% of the distance between the top surface of variable resistance material 32B and the depth direction position of the peak concentration. Based on this, variable resistance material 32B is partly removed by a thickness that is one fourth (=t) of the thickness (=4t) from the top surface to the depth direction position of the peak concentration. As a result of such etch back, the variable resistance material 32C has such a dopant concentration distribution as shown in FIG. 5.

As described above, it is known that the concentration distribution of impurities introduced into a target by ion implantation has a normal distribution in the depth direction of the target (i.e., in the direction away from the surface from which the ions are introduced). On the other hand, the dopant concentration distribution in the variable resistance material 32 does not have part at the end of the normal distribution. Therefore, the dopant concentration in the variable resistance material 32 is much higher than zero in the top surface and continues to increase toward the peak concentration. As described with reference to FIG. 10, the dopant concentration in the top surface depends on the target values of the threshold voltage and forming voltage, and further depends on such factors as the position of the peak concentration and the energy of ion implantation. Therefore, the concentration in the top surface depends on the design factors of the memory device 1. However, because of the characteristics of normal distribution, the variable resistance material 32 has a concentration which is one eighth or more of the peak concentration in the top surface.

<1.8. Advantages (Effects)>

According to the first embodiment, the memory device 1 having high performance can be realized, as described below.

Figure 11:
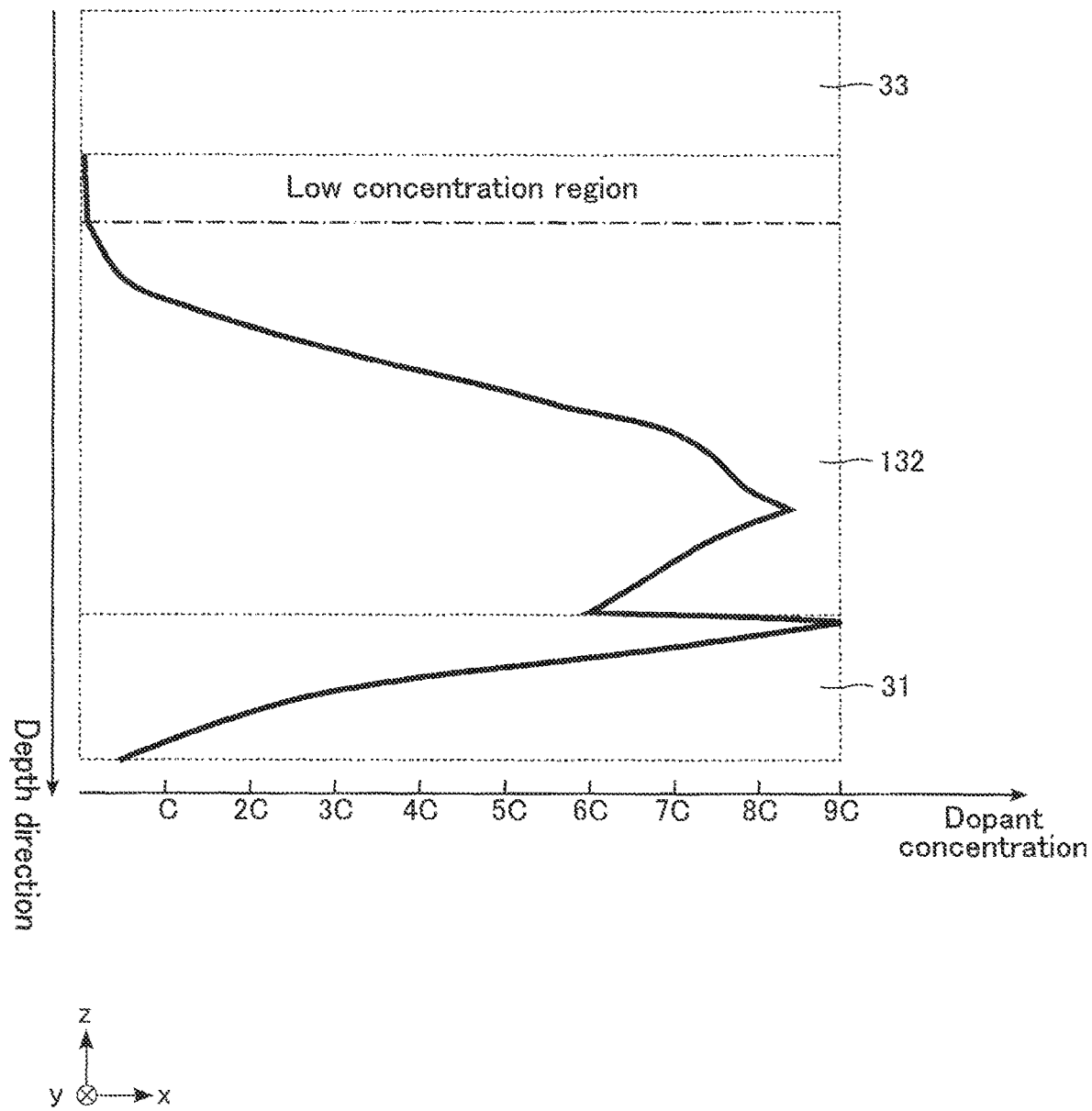
FIG. 11 shows an example of the dopant concentration distribution in a reference variable resistance material.

Similar to FIG. 5, FIG. 11 shows an example of how the dopant concentration distribution is in the variable resistance material 132 of a reference memory cell MCr. The memory cell MCr includes a variable resistance material 132 in place of variable resistance material 32 of the first embodiment. The memory cell MCr is formed by providing an upper electrode 33 without etch back of the variable resistance material 132 after the dopant is introduced into the variable resistance material 132. Therefore, the dopant concentration distribution in the variable resistance material 132 is the same as that immediately after the dopant is introduced. As described with reference to FIGS. 5 and 10, the concentration of impurities introduced by ion implantation has a Gaussian distribution. Therefore, as can be seen from FIG. 11 as well, the variable resistance material 132 has a region having a dopant concentration which is very low and close to zero (low concentration region) in a portion including the top surface. Such a low concentration region contributes to the determination of the threshold voltage and forming voltage of the variable resistance material 132. That is, a current does not easily flow through the region having a small amount of dopant, and therefore, the presence of the low concentration region may unintentionally increase the threshold voltage and forming voltage of the variable resistance material 132. This is shown in FIG. 10 as well. As shown in FIG. 10, where the etch back thickness is zero, the threshold voltage and the forming voltage have values higher than the target values.

According to the memory device 1 of the first embodiment, the variable resistance material 32 has a dopant concentration much higher than zero even in the top surface of the variable resistance material 32, that is, in the interface between the variable resistance material 32 and the upper electrode 33. For example, the dopant concentration in the top surface of the variable resistance material 32 is higher than the dopant concentration in the bottom surface of the lower electrode 31, and is, for example, approximately one fourth of the peak concentration of the variable resistance material 32. Therefore, the threshold voltage and forming voltage of variable resistance material 32 are lower than the threshold voltage and forming voltage of variable resistance material 132. Therefore, the memory device 1 can operate with less power consumption than a memory device including the reference memory cell MCr.

Second Embodiment

The second embodiment differs from the first embodiment in light of the structure of selector SE. In the other points, the second embodiment is similar to the first embodiment. Of the configurations of the second embodiment, those different from the configurations of the first embodiment will be mainly described.

<2.1. Structure (Configuration)>

Figure 12:
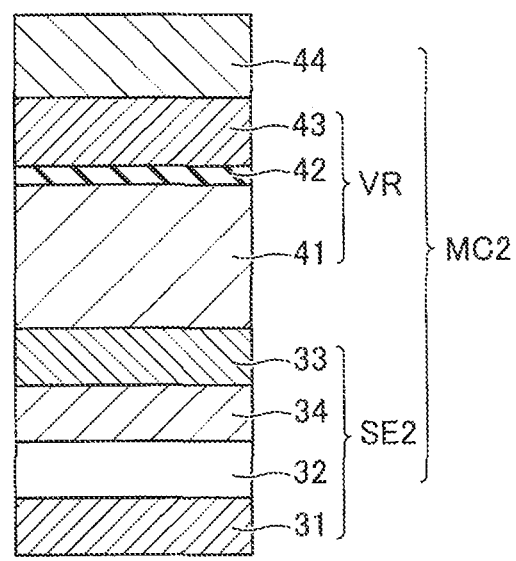
FIG. 12 shows a cross section of an example of a structure of a memory cell of the second embodiment.
Figure 12:
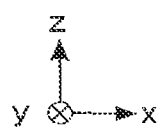

FIG. 12 shows a cross section of an example of a structure of a memory cell of the second embodiment. The memory cell MC and selector SE of the second embodiment may be referred to as memory cell MC2 and selector SE2, respectively, to distinguish them from the memory cell MC and selector SE of the first embodiment.

As shown in FIG. 12, the selector SE2 further includes a conductor 34. The conductor 34 is located on the top surface of the variable resistance material 32. The upper electrode 33 is located on the top surface of the conductor 34. The conductor 34 contains a conductive element, such as a metal, and ions that can be used in IBE. The conductor 34 can function as an electrode together with the upper electrode 33.

<2.2. Dopant Concentration Distribution in Variable Resistance Material>

Figure 13:
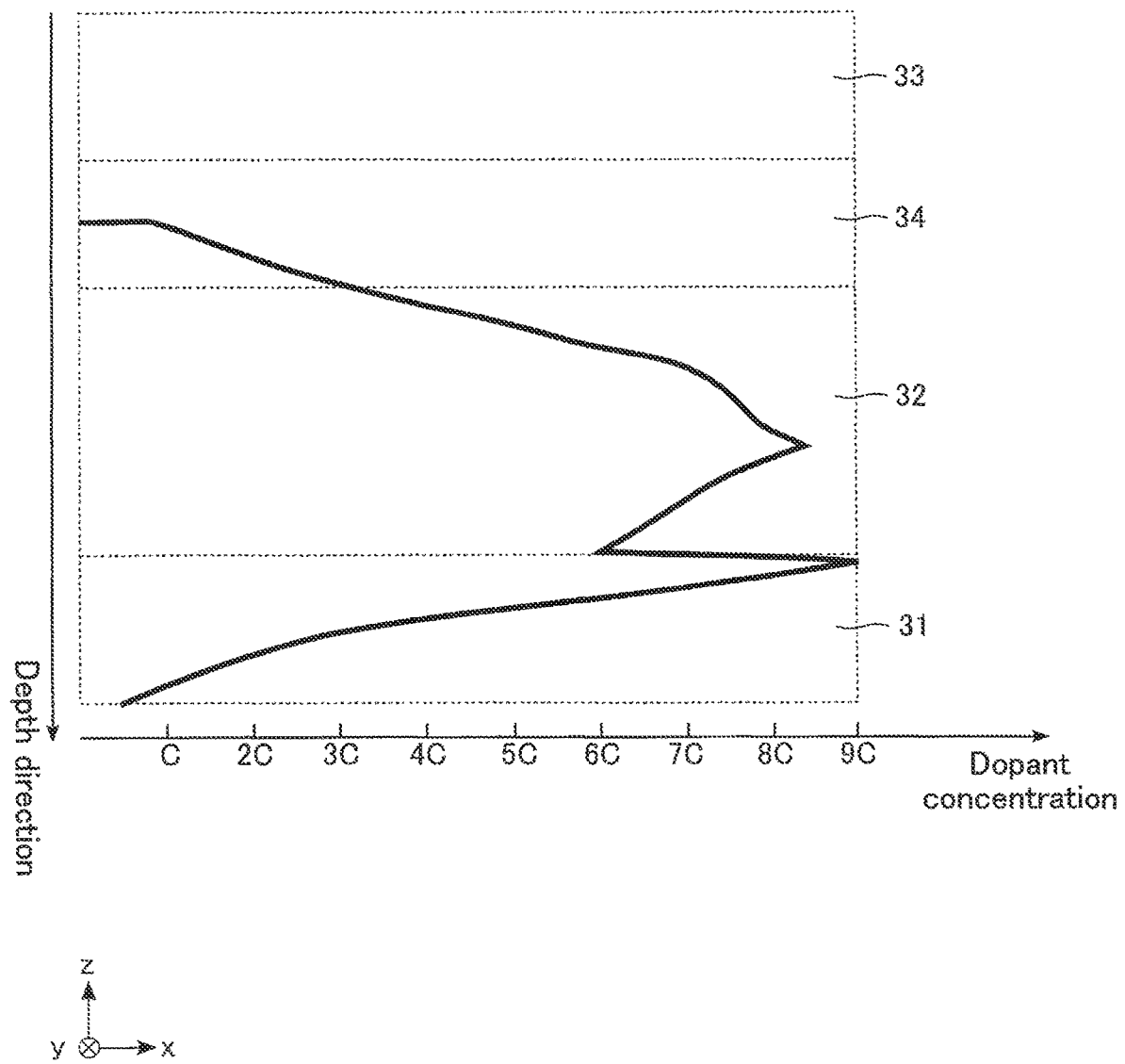
FIG. 13 shows an example of how the dopant concentration distribution is in a variable resistance material and surrounding components of the second embodiment.

FIG. 13 shows an example of how the dopant concentration distribution is in the variable resistance material 32 and surrounding components of the second embodiment. FIG. 13 shows a dopant concentration distribution obtained by performing ion implantation under certain conditions into the variable resistance material 32 having a certain thickness and executing subsequent processing (described below).

As shown in FIG. 13, the dopant is distributed not only in the variable resistance material 32 and the lower electrode 31, as in the first embodiment, but also in the conductor 34. The dopant concentration distribution decreases vertically along the z-axis (depth direction) from the peak in the variable resistance material 32 as a center and approximates a Gaussian distribution.

As described above, the dopant concentration distribution extends over the variable resistance material 32 and the conductor 34. Therefore, a low concentration portion of the dopant concentration distribution is located in the conductor 34. Thus, the concentration of the dopant is high even in the top surface of the variable resistance material 32. In the example shown in FIG. 13, the peak concentration is approximately 8C, while the dopant concentration in the top surface of the variable resistance material 32 is approximately 3C. Of the dopant concentration distribution, a portion in which the dopant concentration is C or less is located in the conductor 34.

<2.3. Manufacturing Method>

Figure 14:
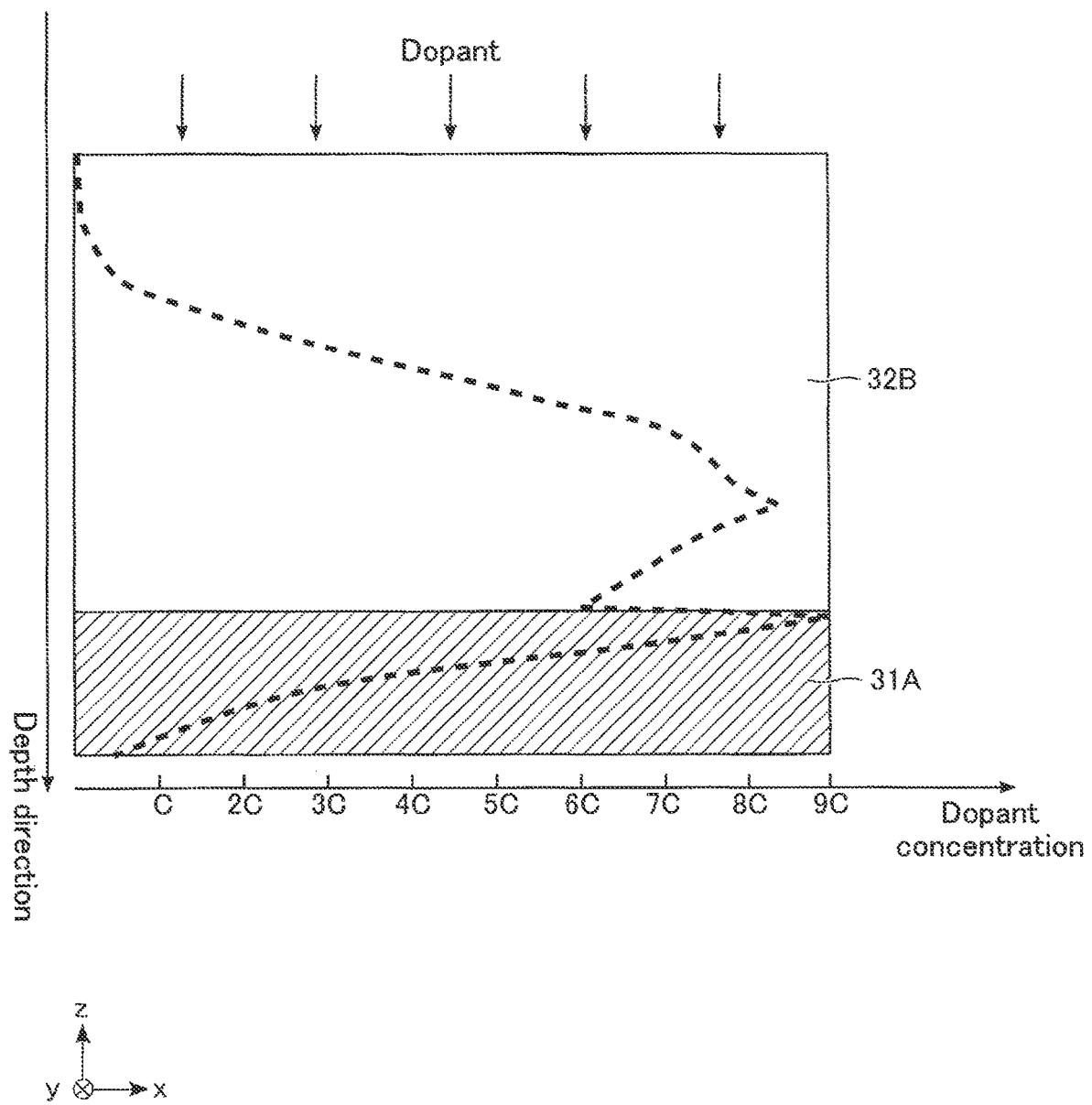
FIGS. 14 to 16 sequentially show how structures of part of the memory device of the second embodiment are during a manufacturing process.
Figure 15:
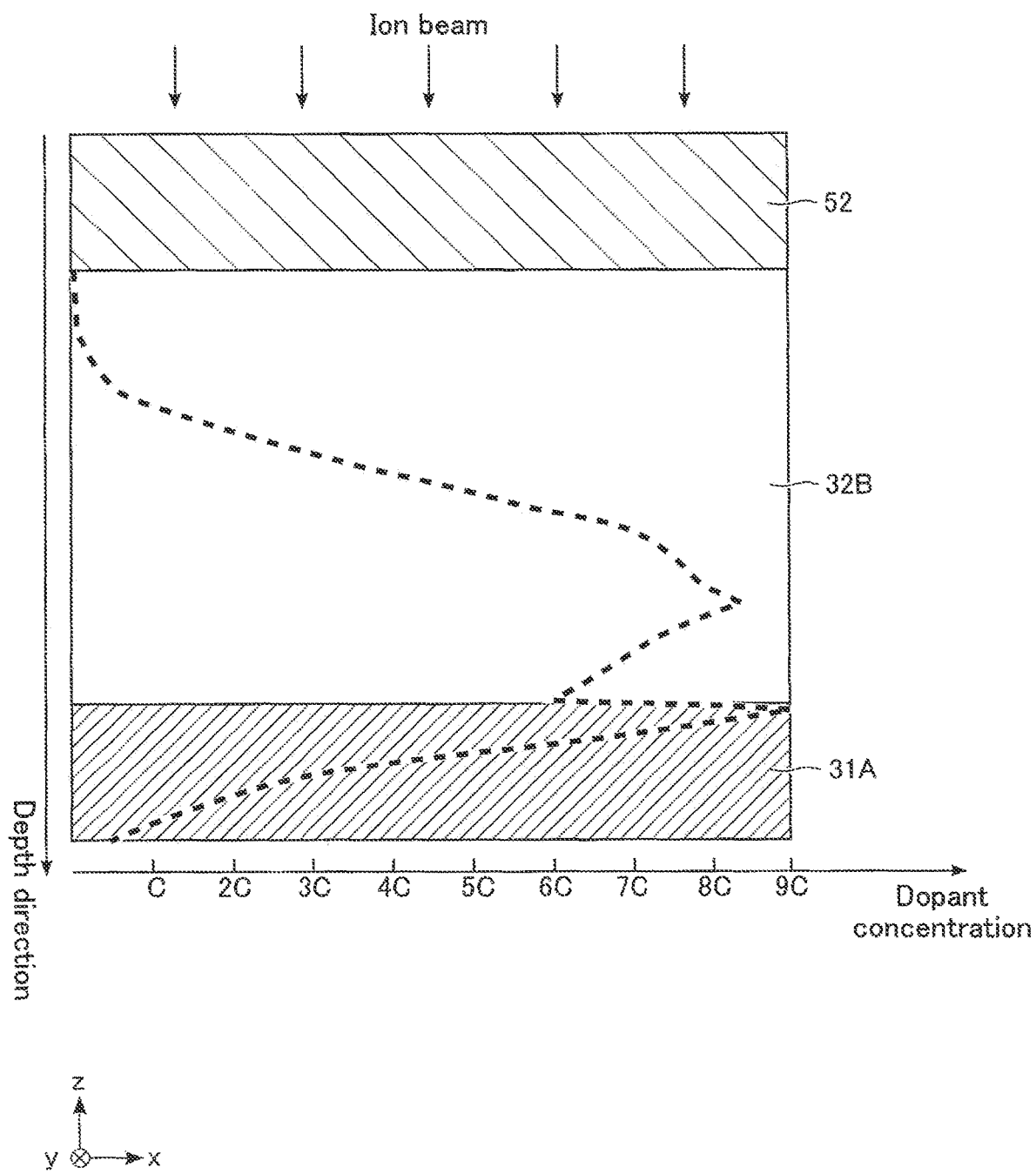
Figure 16:
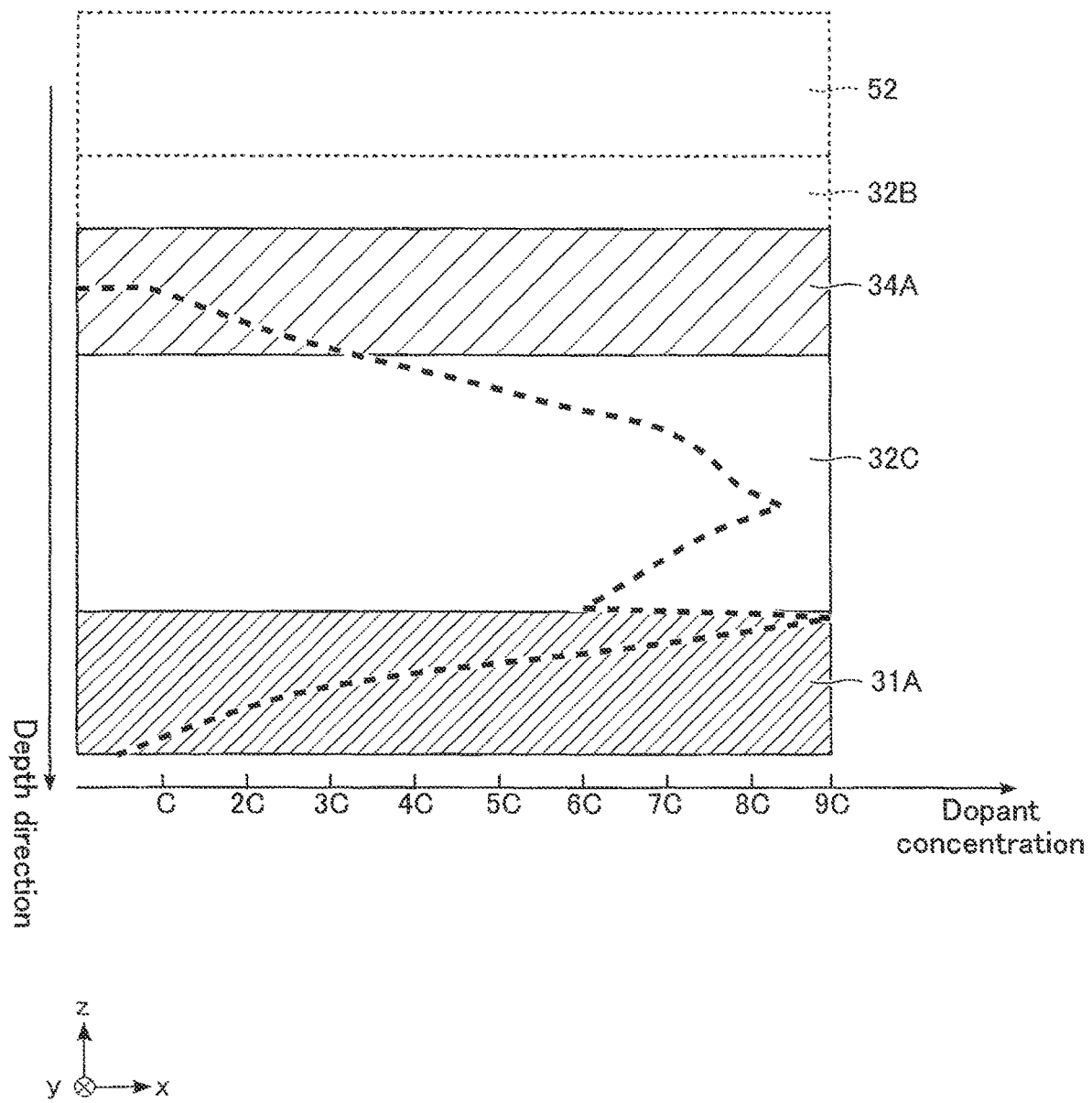

A manufacturing method of the memory device of the second embodiment will be described with reference to FIGS. 14 to 16. FIGS. 14 to 16 sequentially show how structures of part of the memory device of the second embodiment are during a manufacturing process. Similar to FIG. 13, FIGS. 14 to 16 show a dopant concentration distribution, and the dopant concentration distribution is indicated by broken lines.

As shown in FIG. 14, the steps shown in FIGS. 6 and 7 of the first embodiment are executed. As a result, a dopant concentration distribution is formed.

As shown in FIG. 15, a metal layer 52 is formed on the top surface of the variable resistance material 32B. The metal layer 52 is made of, for example, the same material as the upper electrode 33 or the same material as a material contained in the upper electrode 33. For example, the metal layer 52 contains or is made of TiN. Next, IBE is performed from above the metal layer 52. Examples of ion beams for IBE include Ar, Kr and Xe.

As shown in FIG. 16, the IBE shown in FIG. 15 is continued. The IBE causes part of the ions to enter the variable resistance material 32B. Further, owing to the energy of IBE, part of the metal element in the metal layer 52 also enters the variable resistance material 32B. As a result, a conductor 34A is formed in an upper portion of the variable resistance material 32B, and a variable resistance material 32C is formed as well. The conductor 34A is a component that is processed into conductor 34 in a later process. IBE is continued and the metal layer 52 is removed. IBE is further continued, and the top surface of the conductor 34A is also lowered. Therefore, the set of variable resistance material 32C and conductor 34A is thinner than the variable resistance material 32B.

Thereafter, as described with reference to FIG. 9, an upper electrode 33A, a ferromagnet 41A, an insulator 42A, a ferromagnet 43A and a hard mask 44A are formed in this order on the top surface of the conductor 34A. Next, the ferromagnet 43A, insulator 42A, ferromagnet 41A, upper electrode 33A, conductor 34A, variable resistance material 32C and lower electrode 31A are partially removed by IBE, using the hard mask 44A as a mask. As a result, as shown in FIG. 12, ferromagnet 43, insulator 42, ferromagnet 41, upper electrode 33, conductor 34, variable resistance material 32 and lower electrode 31 are formed.

<2.4. Advantages>

According to the memory device 1 of the second embodiment, the low dopant concentration portion of variable resistance material 32B, which will be formed into variable resistance material 32, is processed into conductor 34A and functions as part of the electrode. Therefore, the variable resistance material 32 has a dopant concentration much higher than zero even in the top surface of the variable resistance material 32, that is, in the interface between the variable resistance material 32 and the conductor 34. For example, the dopant concentration in the top surface of the variable resistance material 32 is higher than the dopant concentration in the bottom surface of the lower electrode 31, and is, for example, approximately one fourth of the peak concentration of the variable resistance material 32. Therefore, because of the same principle as the first embodiment, the memory device 1 can operate with less power consumption than a memory device including the reference memory cell MCr.

Third Embodiment

The third embodiment differs from the first embodiment in light of the structure of selector SE. In the other points, the third embodiment is similar to the first embodiment. Of the configurations of the third embodiment, those different from the configurations of the first embodiment will be mainly described.

<3.1. Structure (Configuration)>

Figure 17:
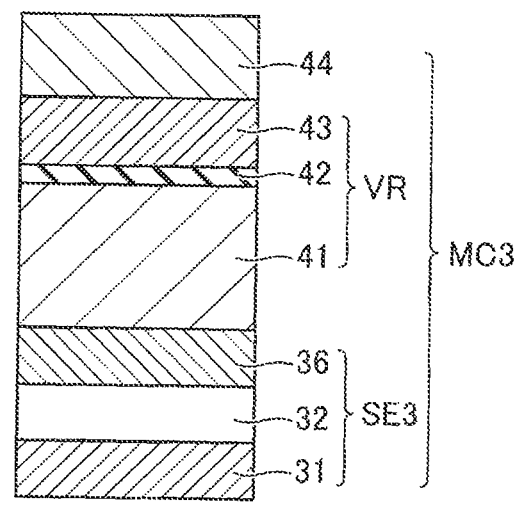
FIG. 17 shows a cross section of an example of a structure of a memory cell of the third embodiment.

FIG. 17 shows a cross section of an example of a structure of a memory cell MC of the third embodiment. The memory cell MC and selector SE of the third embodiment may be referred to as memory cell MC3 and selector SE3, respectively, to distinguish them from the memory cell MC and selector SE of the first embodiment.

As shown in FIG. 17, the selector SE3 includes an upper electrode 36 in place of the upper electrode 33 of the first embodiment. The upper electrode 36 is located on the top surface of the variable resistance material 32. The upper electrode 36 contains the same dopant as the dopant contained in the variable resistance material 32.

<3.2. Dopant Concentration Distribution in Variable Resistance Material>

Figure 18:
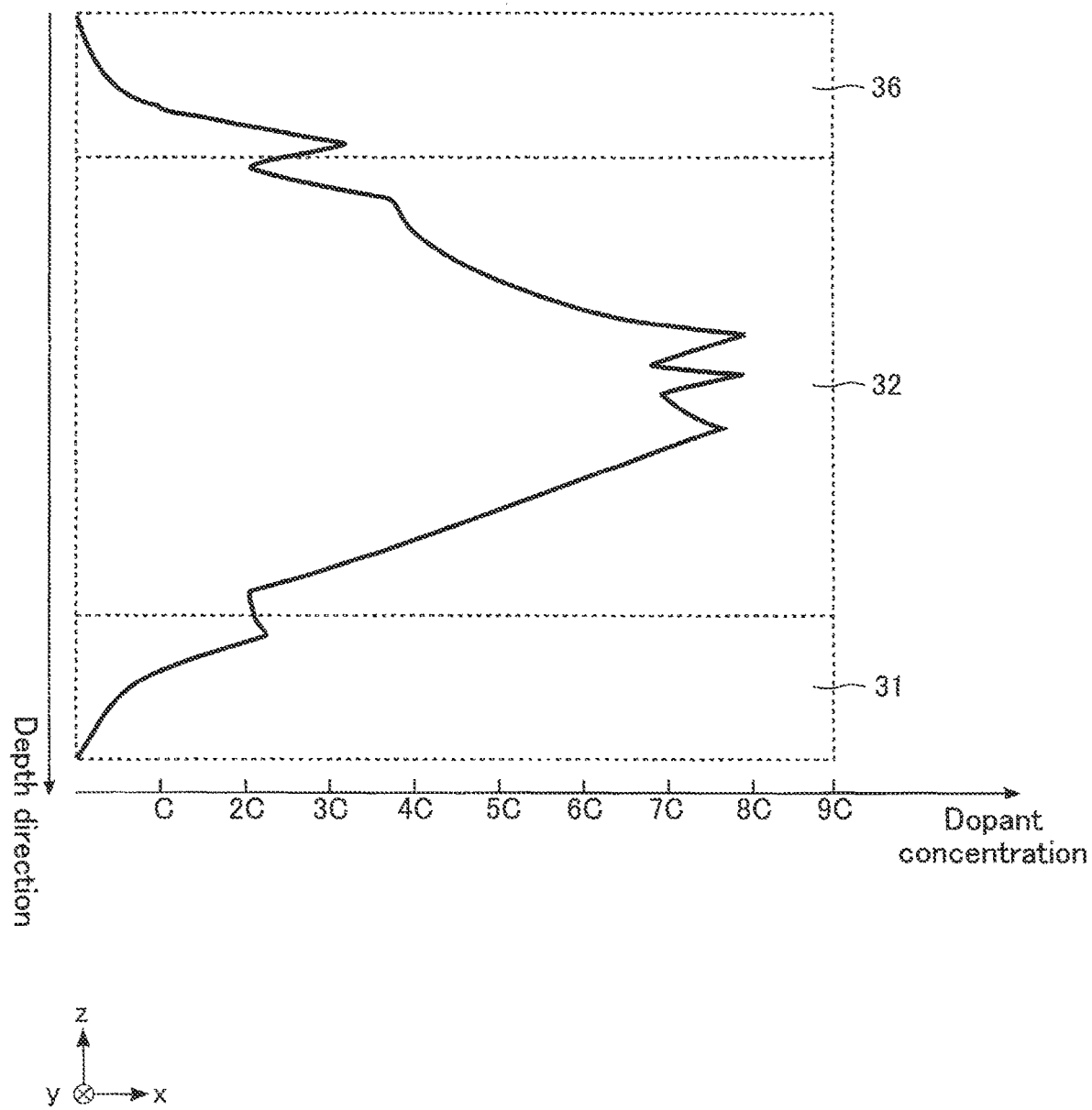
FIG. 18 shows an example of how the dopant concentration distribution is in a variable resistance material and surrounding components of the third embodiment.

FIG. 18 shows an example of how the dopant concentration distribution is in the variable resistance material 32 and surrounding components of the third embodiment. FIG. 18 shows a dopant concentration distribution obtained by performing ion implantation for the variable resistance material 32 of a certain thickness under certain conditions.

As shown in FIG. 18, the dopant is distributed not only in the variable resistance material 32 and the lower electrode 31, as in the first embodiment, but also in the upper electrode 36. The dopant concentration distribution decreases vertically along the z-axis from the peak in the variable resistance material 32 as a center and approximates a Gaussian distribution.

As described above, the concentration distribution of the dopant extends over the variable resistance material 32 and the upper electrode 36. Therefore, a low concentration portion of the dopant concentration distribution is located in the upper electrode 36. Thus, the concentration of the dopant is high even in the top surface of the variable resistance material 32. In the example shown in FIG. 18, the peak concentration is approximately 8C, while the dopant concentration in the top surface of the variable resistance material 32 is approximately 2C. A low dopant concentration portion of the dopant concentration distribution, for example, a portion having C or less, is located in the upper electrode 36.

<3.3. Manufacturing Method>

Figure 19:
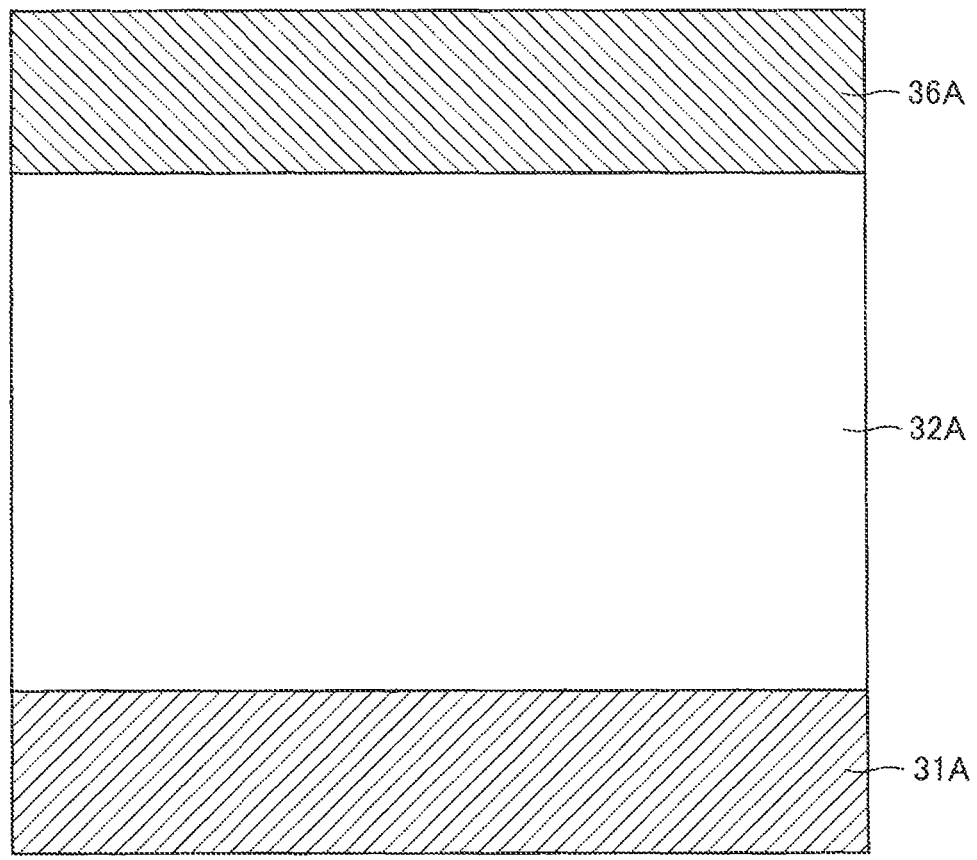
FIGS. 19 to 20 sequentially show how structures of part of the memory device of the third embodiment are during a manufacturing process.
Figure 20:
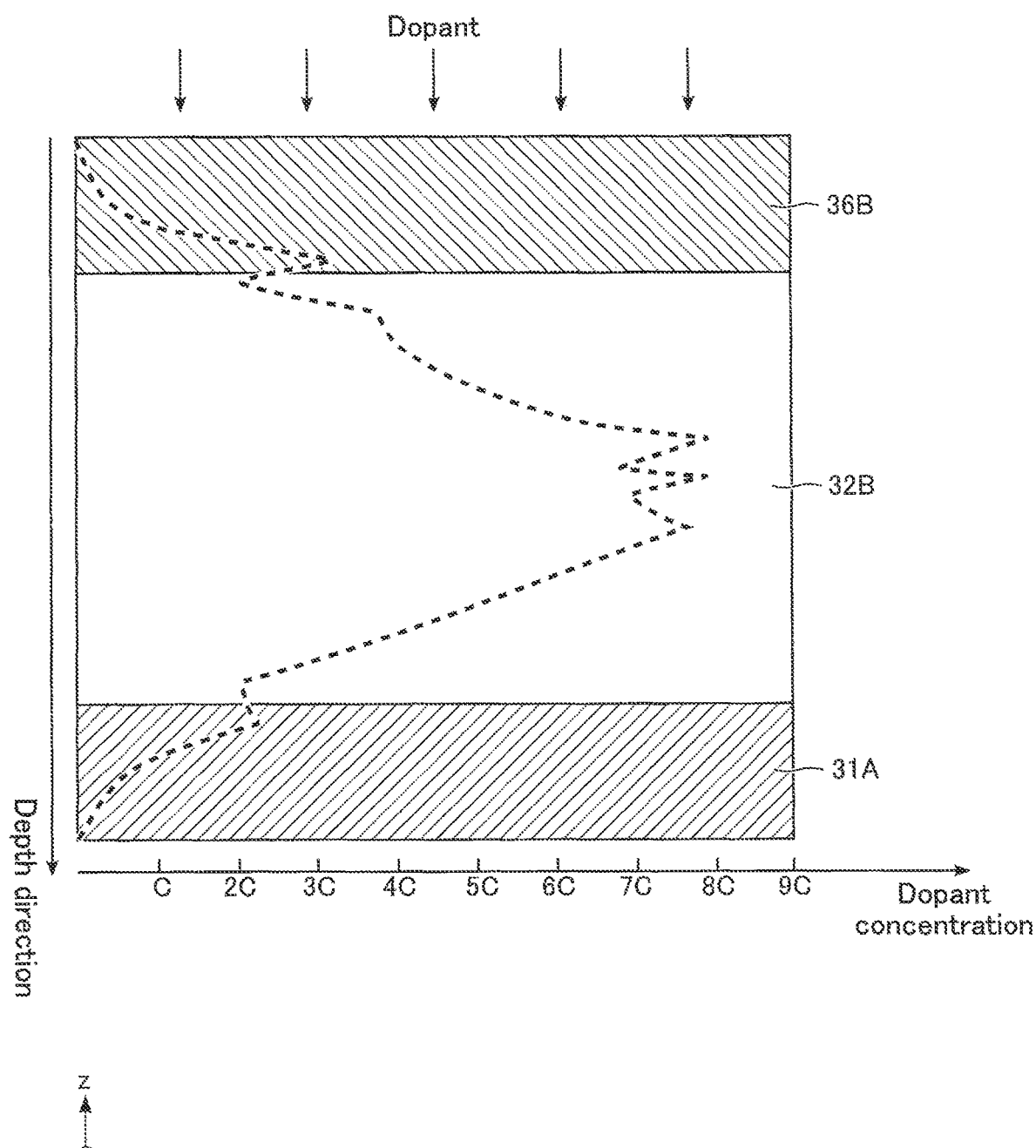

A manufacturing method of the memory device of the third embodiment will be described with reference to FIGS. 19 to 20. FIGS. 19 to 20 sequentially show how structures of part of the memory device of the third embodiment are during a manufacturing process. Similar to FIG. 18, FIGS. 19 to 20 show a dopant concentration distribution, and the dopant concentration distribution is indicated by broken lines.

As shown in FIG. 19, the step shown in FIG. 6 of the first embodiment is performed to form a lower electrode 31A and a silicon oxide 32A. Further, an upper electrode 36A is formed on the top surface of the silicon oxide 32A. The upper electrode 36A is a component that is processed into upper electrode 36 in a later process.

As shown in FIG. 20, as in the step shown in FIG. 7 of the first embodiment, arsenic ions are introduced by ion implantation from above the upper electrode 36A. The silicon oxide 32A, which is a target of ion implantation, is covered with the upper electrode 36A. Therefore, the energy of the ions attenuates while the ions pass through the upper electrode 36A. With this attenuation taken into account, ion implantation is performed using a dose and energy that allow the variable resistance material 32 to have desired properties. For example, the ion implantation is performed under the condition that causes the peak concentration of the dopant to be located near the center of the silicon oxide 32A as viewed in the depth direction. By the ion implantation, the silicon oxide 32A and the upper electrode 36A are turned into variable resistance material 32B and upper electrode 36B, respectively. The upper electrode 36B is a component that is processed into upper electrode 36 in a later process. The low concentration portion of the dopant concentration distribution formed by the ion implantation is located in the upper electrode 36A. Therefore, the dopant concentration is also high in the top surface of the variable resistance material 32, as described with reference to FIG. 18.

Thereafter, as described with reference to FIG. 9, a ferromagnet 41A, an insulator 42A, a ferromagnet 43A and a hard mask 44A are formed in this order on the top surface of the upper electrode 36B. Next, the ferromagnet 43A, insulator 42A, ferromagnet 41A, upper electrode 36B, variable resistance material 32B and lower electrode 31A are partially removed by IBE, using the hard mask 44A as a mask. As a result, as shown in FIG. 12, ferromagnet 43, insulator 42, ferromagnet 41, upper electrode 36, variable resistance material 32 and lower electrode 31 are formed.

<3.4. Advantages>

According to the memory device 1 of the third embodiment, the silicon oxide 32A, which will be formed into the variable resistance material 32, contains the dopant introduced through the upper electrode 36B. Therefore, the silicon oxide 32A has a dopant concentration much higher than zero even in the top surface of the silicon oxide 32A, that is, in the interface between the silicon oxide 32A and the upper electrode 36A. Therefore, the variable resistance material 32 has a dopant concentration much higher than zero even in the top surface of the variable resistance material 32, that is, in the interface between the variable resistance material 32 and the upper electrode 36. For example, the dopant concentration in the top surface of the variable resistance material 32 is higher than the dopant concentration in the bottom surface of the lower electrode 31, and is, for example, approximately one fourth of the peak concentration of the variable resistance material 32. Therefore, because of the same principle as the first embodiment, the memory device 1 can operate with less power consumption than a memory device including the reference memory cell MCr.

Fourth Embodiment

The fourth embodiment is used in combination with the first embodiment or the second embodiment and relates to a method of manufacturing the memory cell MC.

<4.1. Case of Combination with First Embodiment>

Figure 21:
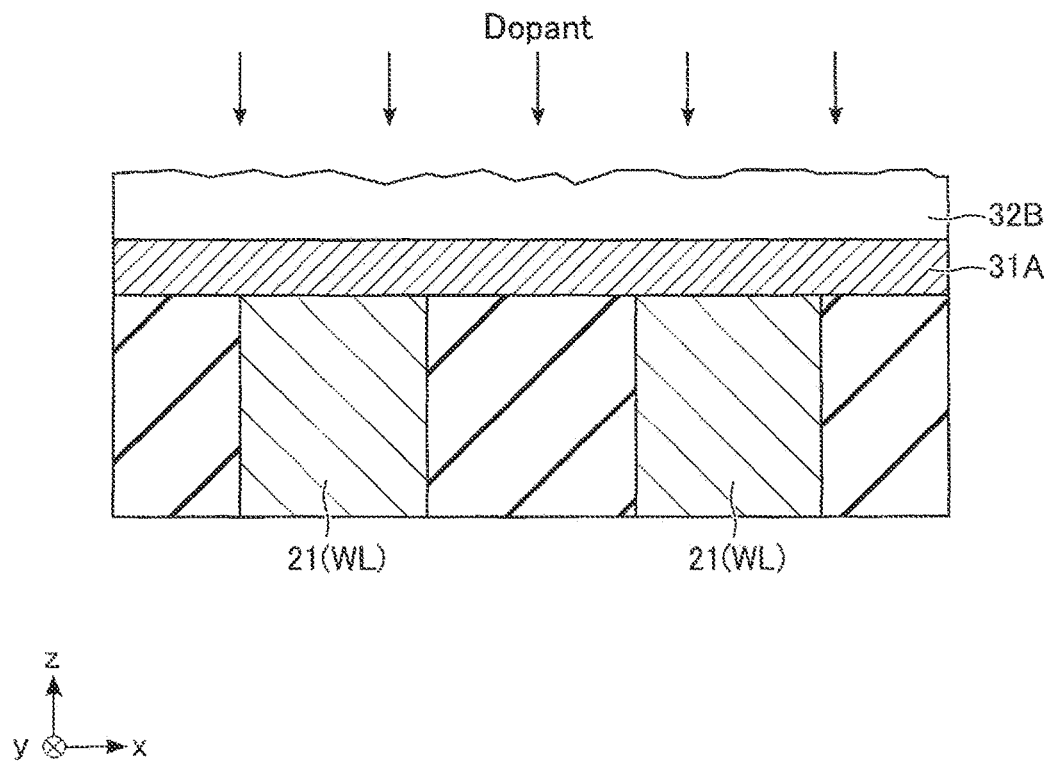
Figure 22:
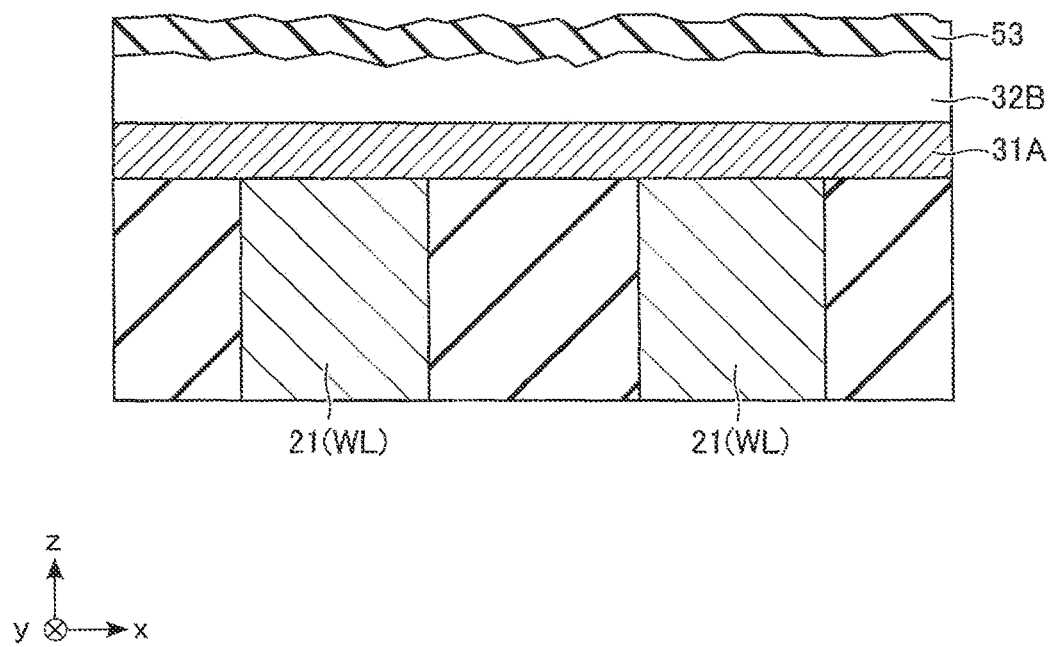

FIGS. 21 to 23 sequentially show how structures of part of a memory device of the fourth embodiment are during a manufacturing process. FIGS. 21 to 23 show the case where the fourth embodiment is combined with the first embodiment.

FIG. 21 shows a structure subsequent to that shown in FIG. 6 of the first embodiment, and shows a process corresponding to the process of FIG. 7. As shown in FIG. 21, as a result of the ion implantation of the dopant, the arithmetic mean roughness Ra (which may be hereinafter referred to simply as roughness) of the surface of the variable resistance material 32B (silicon oxide 32A) located in the surface portion is increased and may be higher than that before the ion implantation is performed.

As shown in FIG. 22, a sacrificial material 53 is formed on the top surface of the variable resistance material 32B. The sacrificial material 53 includes or made of, for example, the same material as the variable resistance material 32B before ion implantation. That is, the sacrificial material 53 includes or is made of, for example, silicon oxide.

As shown in FIG. 23, the structure obtained up to this point is subjected to etch back by IBE. The ion beam has a low angle with respect to the xy plane, for example, an angle of 10° to 30°. The sacrificial material 53 is removed by IBE. The IBE is continued to partially remove the top surface of the variable resistance material 32B. The low-angle ion beam not only removes the target to be etched but also planarizes the surface of the target exposed to the ion beams (i.e., the top surface). Therefore, the IBE reduces the roughness of the top surface of variable resistance material 32B and thus forms variable resistance material 32C.

The process shown in FIG. 23 continues to the process shown in FIG. 9 of the first embodiment.

<4.2. Case of Combination with Second Embodiment>

Figure 25:
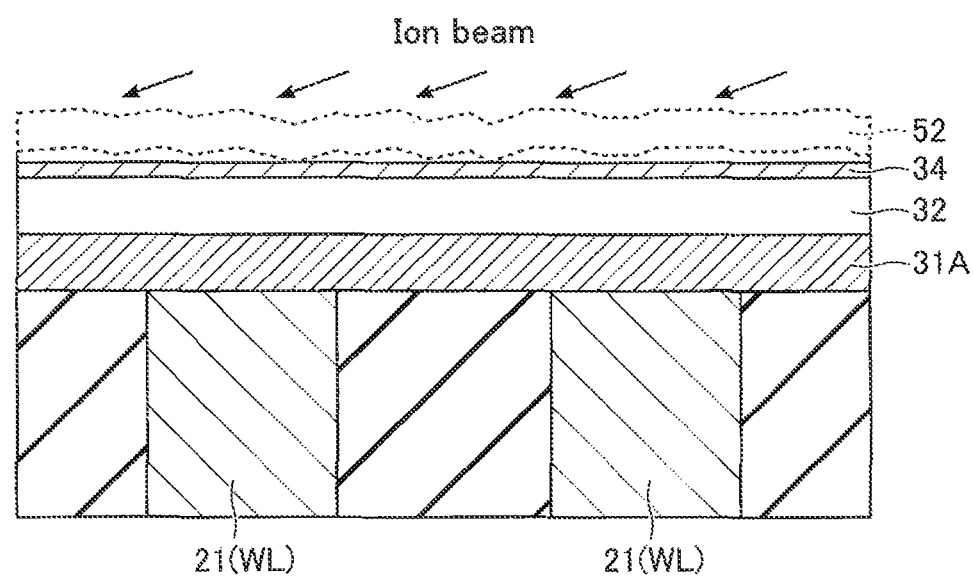

FIGS. 24 and 25 sequentially show how structures of part of the memory device of the fourth embodiment are during a manufacturing process. FIGS. 24 to 25 show the case where the fourth embodiment is combined with the second embodiment.

FIG. 24 shows a structure that is subsequent to the structure shown in FIG. 14 of the second embodiment. As shown in FIG. 24, as a result of the ion implantation of the dopant, the roughness of the surface of the variable resistance material 32B (silicon oxide 32A) located in the surface portion is increased and may be higher than that before the ion implantation. Then, a metal layer 52 is formed on the top surface of the variable resistance material 32B.

As shown in FIG. 25, the structure obtained up to this point is subjected to etch back by IBE. As described with reference to FIG. 23, the ion beams have a low angle with respect to the xy plane, for example, an angle of 10° to 30°. The IBE removes the metal layer 52 and forms a conductor 34 in an upper portion of the variable resistance material 32B, as described with reference to FIG. 16 in connection with the second embodiment. The low-angle IBE reduces the roughness of the top surface of the conductor 34, as described with reference to FIG. 23.

The process of FIG. 25 continues to the process described with reference to FIG. 9 in connection with the second embodiment.

<4.3. Angle of Ion Beam>

Figure 26:
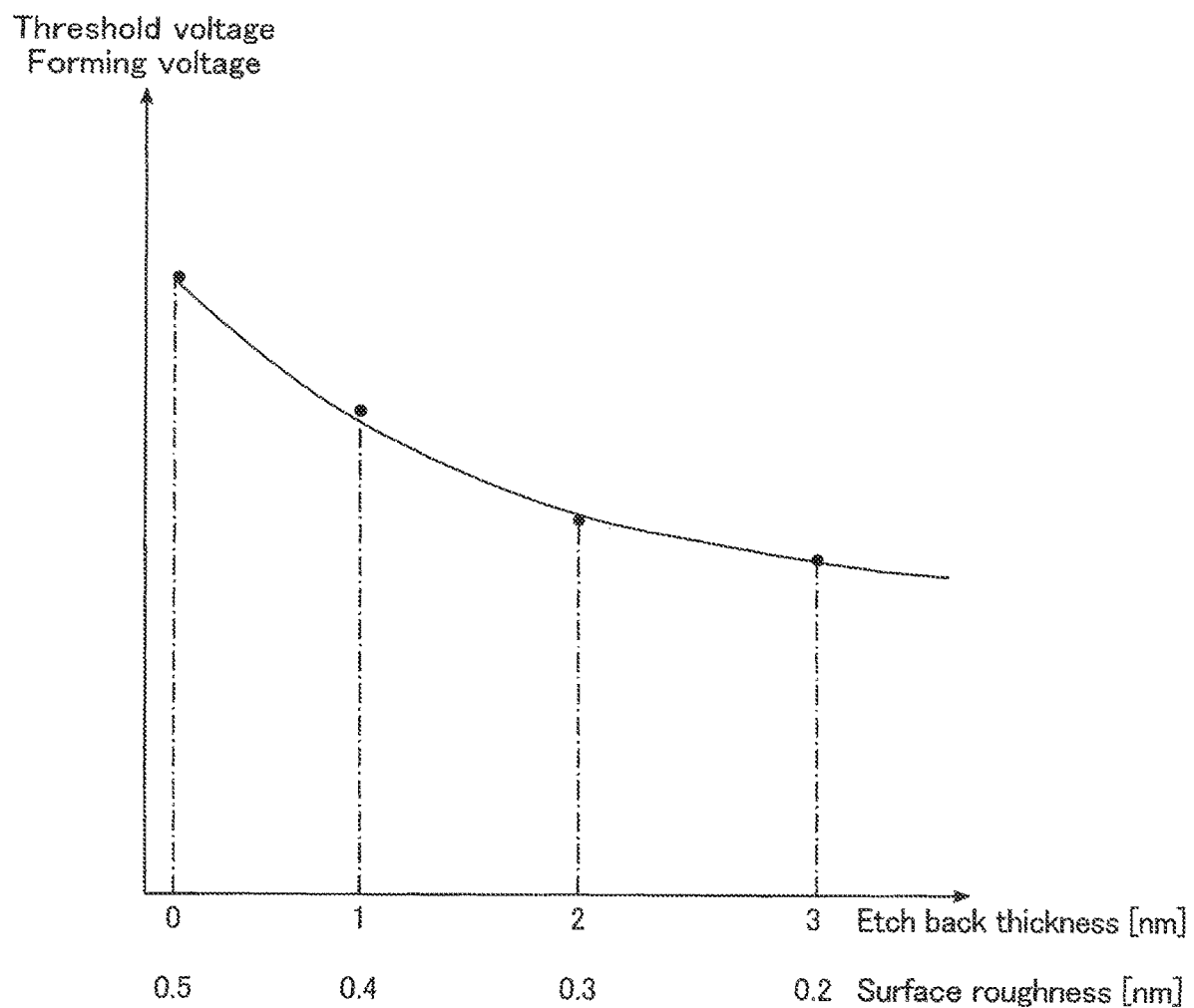
FIG. 26 shows a relationship between the surface roughness of the variable resistance material of the fourth embodiment and the characteristics of a memory cell.

With reference to FIG. 26, a description will be given as to how the roughness of an etching target is reduced by the etching using a low-angle ion beam.

FIG. 26 shows a relationship between the roughness of the surface (particularly the top surface) of the variable resistance material 32 of the fourth embodiment and the characteristics of a memory cell MC. A forming voltage and a threshold voltage are shown as typical characteristics. As shown in FIG. 26, the forming voltage and the threshold voltage depend on the roughness of the surface of the variable resistance material 32. Where the surface roughness is small, the forming voltage and the threshold voltage are low. The reason is that where the surface roughness is high, the non-uniformity of the electric field generated in the variable resistance material 32 is high.

<4.4. Advantages>

According to the fourth embodiment, the surface of the variable resistance material 32 is etched by low-angle IBE. Therefore, the surface roughness of the variable resistance material 32 is low. In the variable resistance material 32 having a low surface roughness, the non-uniformity of the electric field is suppressed. Therefore, a memory device 1 including a memory cell MC having high performance can be realized by the low forming voltage and the low threshold voltage.

<5. Modification>

In the above, the embodiments were described referring to an example in which each memory cell MC has a selector in the lower portion and a variable resistance element VR in the upper portion. However, each memory cell MC may have a selector in the upper portion and a variable resistance element VR in the lower portion.

In the embodiments described above, reference was made to an example in which in each variable resistance element VR, the ferromagnet 43 that functions as a so-called storage layer is located below the insulator 42, and the ferromagnet 41 that functions as a so-called reference layer is located above the insulator 42. However, the ferromagnet 43 may be located below the insulator 42 and the ferromagnet 41 may be located above the insulator 42.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a memory device including a silicon oxide and a variable resistance element electrically coupled to the silicon oxide, comprising:
   introducing a dopant into the silicon oxide from a first surface of the silicon oxide by ion implantation;
   thinning the silicon oxide by etching the first surface of the silicon oxide with an ion beam; and
   removing a first part of the thinned silicon oxide to leave a second part of the thinned silicon oxide, after the thinning of the silicon oxide.

2. The method of claim 1, further comprising:
   forming a metal on the first surface of the silicon oxide after the introducing the dopant into the silicon oxide;
   wherein the thinning of the silicon oxide comprises etching the metal with an ion beam before the etching of the first surface of the silicon oxide.

3. The method of claim 2, wherein the thinning of the silicon oxide includes forming a conductor on part of the silicon oxide.

4. The method of claim 1, further comprising:
   forming a conductor or an insulator on the first surface of the silicon oxide before the thinning of the first surface of the silicon oxide,
   wherein the thinning of the first surface of the silicon oxide includes removing the conductor or the insulator, and
   the ion beam has an angle of 10° or more and 30° or less with respect to a plane in which the conductor or the insulator spreads.

5. The method of claim 1, wherein the dopant includes arsenic, germanium, or antimony.

6. The method of claim 1, wherein the variable resistance element has one of two resistances that differ from each other in a steady state.

7. The method of claim 1, wherein the variable resistance element includes a first ferromagnetic layer, a second ferromagnetic layer, and an insulating layer between the first ferromagnetic layer and the second ferromagnetic layer.

* * * * *